(12) United States Patent
Anthony

(10) Patent No.: US 6,954,346 B2
(45) Date of Patent: Oct. 11, 2005

(54) FILTER ASSEMBLY

(75) Inventor: Anthony Anthony, Erie, PA (US)

(73) Assignee: XZY Attenuators, LLC, Erie, PA (US)

( * ) Notice: Subject to any disclaimer, the term of this patent is extended or adjusted under 35 U.S.C. 154(b) by 0 days.

(21) Appl. No.: 10/895,062

(22) Filed: Jul. 21, 2004

(65) Prior Publication Data

US 2005/0018374 A1 Jan. 27, 2005

Related U.S. Application Data

(63) Continuation-in-part of application No. 10/443,764, filed on Sep. 16, 2003, which is a continuation of application No. 09/917,245, filed on Jul. 27, 2001, now Pat. No. 6,594,128, which is a continuation of application No. 09/460,218, filed on Dec. 13, 1999, now Pat. No. 6,331,926, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.

(60) Provisional application No. 60/488,441, filed on Jul. 21, 2003, provisional application No. 60/500,348, filed on Sep. 5, 2003, provisional application No. 60/502,280, filed on Sep. 12, 2003, provisional application No. 60/523,098, filed on Nov. 19, 2003, and provisional application No. 60/527,004, filed on Dec. 5, 2003.

(51) Int. Cl.[7] ............................................. H02H 9/00
(52) U.S. Cl. ..................... 361/118; 361/58; 361/111; 361/113
(58) Field of Search ........................ 361/118, 119, 361/58, 111, 113

(56) References Cited

U.S. PATENT DOCUMENTS 3,240,621 A   3/1966   Flower, Jr. et al.
3,343,034 A   9/1967   Ovshinsky
3,573,677 A   4/1971   Detar
3,742,420 A   6/1973   Hamden, Jr.
3,790,858 A   2/1974   Brancaleone et al.
3,842,374 A   10/1974  Schlicke
4,023,071 A   5/1977   Fussell
4,135,132 A   1/1979   Tafjord
4,139,783 A   2/1979   Engeler
4,191,986 A   3/1980   ta Huang et al.

(Continued)

FOREIGN PATENT DOCUMENTS

DE   197 28 692 A1   1/1999
DE   198 57 043 C1   3/2000
EP   0933871          8/1999
EP   1022751          7/2000
EP   1024507          8/2000

(Continued)

OTHER PUBLICATIONS

Greb, "An Intuitive Approach to EM Fields," EMC Test & Design, Jan. 1991, pp. 30–33.

Greb, "An Intuitive Approach to EM Coupling," EMC Test & Design, Dec. 1993, pp. 20–25.

Sakamoto, "Noiseproof Power Supplies: What's Important in EMI Removal Filters?" JEE, Jun. 1986, pp. 80–85.

(Continued)

Primary Examiner—Stephen W. Jackson
(74) Attorney, Agent, or Firm—Neifeld IP Law, PC

(57) ABSTRACT

The invention provides electrical filters, circuits including the filters, connectors including the filters, and methods of making and using the same wherein the filter includes a G conductor, an A conductor; and a B conductor, and wherein the three conductors are conductively isolated from one another when said filter is not connected in a circuit.

70 Claims, 7 Drawing Sheets

U.S. PATENT DOCUMENTS

| | | | |
|---|---|---|---|
| 4,198,613 | A | 4/1980 | Whitley |
| 4,259,604 | A | 3/1981 | Aoki |
| 4,262,317 | A | 4/1981 | Baumbach |
| 4,275,945 | A | 6/1981 | Krantz et al. |
| 4,292,558 | A | 9/1981 | Flick et al. |
| 4,308,509 | A | 12/1981 | Tsuchiya et al. |
| 4,320,364 | A | 3/1982 | Sakamoto et al. |
| 4,335,417 | A | 6/1982 | Sakshaug et al. |
| 4,353,044 | A | 10/1982 | Nossek |
| 4,366,456 | A | 12/1982 | Ueno et al. |
| 4,384,263 | A | 5/1983 | Neuman et al. |
| 4,394,639 | A | 7/1983 | McGalliard |
| 4,412,146 | A | 10/1983 | Futterer et al. |
| 4,533,931 | A | 8/1985 | Mandai et al. |
| 4,553,114 | A | 11/1985 | English et al. |
| 4,563,659 | A | 1/1986 | Sakamoto |
| 4,586,104 | A | 4/1986 | Standler |
| 4,587,589 | A | 5/1986 | Marek |
| 4,590,537 | A | 5/1986 | Sakamoto |
| 4,612,140 | A | 9/1986 | Mandai et al. |
| 4,612,497 | A | 9/1986 | Ulmer |
| 4,636,752 | A | 1/1987 | Saito |
| 4,682,129 | A | 7/1987 | Bakermans et al. |
| 4,685,025 | A | 8/1987 | Carlomagno |
| 4,688,151 | A | 8/1987 | Kraus et al. |
| 4,694,265 | A | 9/1987 | Kupper |
| 4,698,721 | A | 10/1987 | Warren |
| 4,703,386 | A | 10/1987 | Speet et al. |
| 4,713,540 | A | 12/1987 | Gilby et al. |
| 4,720,760 | A | 1/1988 | Starr |
| 4,746,557 | A | 5/1988 | Sakamoto et al. |
| 4,752,752 | A | 6/1988 | Okubo |
| 4,760,485 | A | 7/1988 | Ari et al. |
| 4,772,225 | A | 9/1988 | Ulery |
| 4,777,460 | A | 10/1988 | Okubo |
| 4,780,598 | A | 10/1988 | Fahey et al. |
| 4,782,311 | A | 11/1988 | Ookubo |
| 4,789,847 | A | 12/1988 | Sakamoto et al. |
| 4,794,485 | A | 12/1988 | Bennett |
| 4,794,499 | A | 12/1988 | Ott |
| 4,795,658 | A | 1/1989 | Kano et al. |
| 4,799,070 | A | 1/1989 | Nishikawa |
| 4,801,904 | A | 1/1989 | Sakamoto et al. |
| 4,814,295 | A | 3/1989 | Mehta |
| 4,814,938 | A | 3/1989 | Arakawa et al. |
| 4,814,941 | A | 3/1989 | Speet et al. |
| 4,819,126 | A | 4/1989 | Kornrumpf et al. |
| 4,845,606 | A | 7/1989 | Herbert |
| 4,847,730 | A | 7/1989 | Konno et al. |
| 4,904,967 | A | 2/1990 | Morii et al. |
| 4,908,586 | A | 3/1990 | Kling et al. |
| 4,908,590 | A | 3/1990 | Sakamoto et al. |
| 4,924,340 | A | 5/1990 | Sweet |
| 4,942,353 | A | 7/1990 | Herbert et al. |
| 4,967,315 | A | 10/1990 | Schelhorn |
| 4,978,906 | A | 12/1990 | Herbert et al. |
| 4,990,202 | A | 2/1991 | Murata et al. |
| 4,999,595 | A | 3/1991 | Azumi et al. |
| 5,029,062 | A | 7/1991 | Capel |
| 5,034,709 | A | 7/1991 | Azumi et al. |
| 5,034,710 | A | 7/1991 | Kawaguchi |
| 5,051,712 | A | 9/1991 | Naito et al. |
| 5,059,140 | A | 10/1991 | Philippson et al. |
| 5,065,284 | A | 11/1991 | Hernandez |
| 5,073,523 | A | 12/1991 | Yamada et al. |
| 5,079,069 | A | 1/1992 | Howard et al. |
| 5,079,223 | A | 1/1992 | Maroni |
| 5,079,669 | A | 1/1992 | Williams |
| 5,089,688 | A | 2/1992 | Fang et al. |
| 5,105,333 | A | 4/1992 | Yamano et al. |
| 5,107,394 | A | 4/1992 | Naito et al. |
| 5,109,206 | A | 4/1992 | Carlile |
| 5,140,297 | A | 8/1992 | Jacobs et al. |
| 5,140,497 | A | 8/1992 | Kato et al. |
| 5,142,430 | A | 8/1992 | Anthony |
| 5,148,005 | A | 9/1992 | Fang et al. |
| 5,155,655 | A | 10/1992 | Howard et al. |
| 5,161,086 | A | 11/1992 | Howard et al. |
| 5,167,483 | A | 12/1992 | Gardiner |
| 5,173,670 | A | 12/1992 | Naito et al. |
| 5,179,362 | A | 1/1993 | Okochi et al. |
| 5,181,859 | A | 1/1993 | Foreman et al. |
| 5,186,647 | A | 2/1993 | Denkmann et al. |
| 5,208,502 | A | 5/1993 | Yamashita et al. |
| 5,219,812 | A | 6/1993 | Doi et al. |
| 5,220,480 | A | 6/1993 | Kershaw, Jr. et al. |
| 5,236,376 | A | 8/1993 | Cohen |
| 5,243,308 | A | 9/1993 | Shusterman et al. |
| 5,251,092 | A | 10/1993 | Brady et al. |
| 5,261,153 | A | 11/1993 | Lucas |
| 5,262,611 | A | 11/1993 | Danysh et al. |
| 5,268,810 | A | 12/1993 | DiMarco et al. |
| 5,290,191 | A | 3/1994 | Foreman et al. |
| 5,299,956 | A | 4/1994 | Brownell et al. |
| 5,300,760 | A | 4/1994 | Batliwalla et al. |
| 5,310,363 | A | 5/1994 | Brownell et al. |
| 5,311,408 | A | 5/1994 | Ferchau et al. |
| 5,321,373 | A | 6/1994 | Shusterman et al. |
| 5,321,573 | A | 6/1994 | Person et al. |
| 5,326,284 | A | 7/1994 | Bohbot et al. |
| 5,337,028 | A | 8/1994 | White |
| 5,353,189 | A | 10/1994 | Tomlinson |
| 5,353,202 | A | 10/1994 | Ansell et al. |
| 5,357,568 | A | 10/1994 | Pelegris |
| 5,362,249 | A | 11/1994 | Carter |
| 5,362,254 | A | 11/1994 | Siemon et al. |
| 5,378,407 | A | 1/1995 | Chandler et al. |
| 5,382,928 | A * | 1/1995 | Davis et al. ................ 333/182 |
| 5,382,938 | A | 1/1995 | Hansson et al. |
| 5,396,201 | A | 3/1995 | Ishizaki et al. |
| 5,401,952 | A | 3/1995 | Sugawa |
| 5,405,466 | A | 4/1995 | Naito et al. |
| 5,414,393 | A | 5/1995 | Rose et al. |
| 5,414,587 | A | 5/1995 | Kiser et al. |
| 5,420,553 | A | 5/1995 | Sakamoto et al. |
| 5,432,484 | A | 7/1995 | Klas et al. |
| 5,446,625 | A | 8/1995 | Urbish et al. |
| 5,450,278 | A | 9/1995 | Lee et al. |
| 5,451,919 | A | 9/1995 | Chu et al. |
| RE35,064 | E | 10/1995 | Hernandez |
| 5,455,734 | A | 10/1995 | Foreman et al. |
| 5,461,351 | A | 10/1995 | Shusterman |
| 5,463,232 | A | 10/1995 | Yamashita et al. |
| 5,471,035 | A | 11/1995 | Holmes |
| 5,477,933 | A | 12/1995 | Nguyen |
| 5,481,238 | A | 1/1996 | Carsten et al. |
| 5,483,407 | A | 1/1996 | Anastasio et al. |
| 5,488,540 | A | 1/1996 | Hatta |
| 5,491,299 | A | 2/1996 | Naylor et al. |
| 5,493,260 | A | 2/1996 | Park |
| 5,495,180 | A | 2/1996 | Huang et al. |
| 5,500,629 | A | 3/1996 | Meyer |
| 5,500,785 | A | 3/1996 | Funada |
| 5,512,196 | A | 4/1996 | Mantese et al. |
| 5,531,003 | A | 7/1996 | Seifried et al. |
| 5,534,837 | A | 7/1996 | Brandt |
| 5,535,101 | A | 7/1996 | Miles et al. |
| 5,536,978 | A | 7/1996 | Cooper et al. |
| 5,541,482 | A | 7/1996 | Siao |
| 5,544,002 | A | 8/1996 | Iwaya et al. |
| 5,546,058 | A | 8/1996 | Azuma et al. |

| | | | | | | |
|---|---|---|---|---|---|---|
| 5,548,255 A | * | 8/1996 | Spielman .................... 333/132 | 6,034,576 A | 3/2000 | Kuth |
| 5,555,150 A | | 9/1996 | Newman, Jr. | 6,034,864 A | 3/2000 | Naito et al. |
| 5,568,348 A | | 10/1996 | Foreman et al. | 6,037,846 A | 3/2000 | Oberhammer |
| 5,570,278 A | | 10/1996 | Cross | 6,038,121 A | 3/2000 | Naito et al. |
| 5,583,359 A | | 12/1996 | Ng et al. | 6,046,898 A | 4/2000 | Seymour et al. |
| 5,586,007 A | | 12/1996 | Funada | 6,052,038 A | 4/2000 | Savicki |
| 5,592,391 A | | 1/1997 | Muyshondt et al. | 6,061,227 A | 5/2000 | Nogi |
| 5,612,657 A | | 3/1997 | Kledzik | 6,064,286 A | 5/2000 | Ziegner et al. |
| 5,614,881 A | | 3/1997 | Duggal et al. | 6,072,687 A | 6/2000 | Naito et al. |
| 5,619,079 A | | 4/1997 | Wiggins et al. | 6,075,211 A | 6/2000 | Tohya et al. |
| 5,624,592 A | | 4/1997 | Paustian | 6,078,117 A | 6/2000 | Perrin et al. |
| 5,640,048 A | | 6/1997 | Selna | 6,078,229 A | 6/2000 | Funada et al. |
| 5,645,746 A | | 7/1997 | Walsh | 6,088,235 A | 7/2000 | Chiao et al. |
| 5,647,766 A | | 7/1997 | Nguyen | 6,091,310 A | 7/2000 | Utsumi et al. |
| 5,668,511 A | | 9/1997 | Furutani et al. | 6,092,269 A | 7/2000 | Yializis et al. |
| 5,682,303 A | | 10/1997 | Goad | 6,094,112 A | 7/2000 | Goldberger et al. |
| 5,700,167 A | | 12/1997 | Pharney et al. | 6,094,339 A | 7/2000 | Evans |
| 5,708,553 A | | 1/1998 | Hung | 6,097,260 A | 8/2000 | Whybrew et al. |
| 5,719,450 A | | 2/1998 | Vora | 6,097,581 A | 8/2000 | Anthony |
| 5,719,477 A | | 2/1998 | Tomihari | 6,104,258 A | 8/2000 | Novak |
| 5,719,750 A | | 2/1998 | Iwane | 6,104,599 A | 8/2000 | Ahiko et al. |
| 5,751,539 A | | 5/1998 | Stevenson et al. | 6,108,448 A | 8/2000 | Song et al. |
| 5,767,446 A | | 6/1998 | Ha et al. | 6,111,479 A | 8/2000 | Myohga et al. |
| 5,789,999 A | | 8/1998 | Barnett et al. | 6,120,326 A | 9/2000 | Brooks |
| 5,790,368 A | | 8/1998 | Naito et al. | 6,121,761 A | 9/2000 | Herbert |
| 5,796,568 A | | 8/1998 | Baiatu | 6,125,044 A | 9/2000 | Cherniski et al. |
| 5,796,595 A | | 8/1998 | Cross | 6,130,585 A | 10/2000 | Whybrew et al. |
| 5,797,770 A | | 8/1998 | Davis et al. | 6,137,392 A | 10/2000 | Herbert |
| 5,808,873 A | | 9/1998 | Celaya et al. | 6,142,831 A | 11/2000 | Ashman et al. |
| 5,825,628 A | | 10/1998 | Garbelli et al. | 6,144,547 A | 11/2000 | Retseptor |
| 5,828,093 A | | 10/1998 | Naito et al. | 6,147,587 A | 11/2000 | Hadano et al. |
| 5,828,272 A | | 10/1998 | Romerein et al. | 6,150,895 A | 11/2000 | Steigerwald et al. |
| 5,828,555 A | | 10/1998 | Itoh | 6,157,528 A | 12/2000 | Anthony |
| 5,831,489 A | | 11/1998 | Wire | 6,157,547 A | 12/2000 | Brown et al. |
| 5,834,992 A | | 11/1998 | Kato et al. | 6,163,454 A | 12/2000 | Strickler |
| 5,838,216 A | | 11/1998 | White et al. | 6,163,456 A | 12/2000 | Suzuki et al. |
| 5,867,361 A | | 2/1999 | Wolf et al. | 6,165,814 A | 12/2000 | Wark et al. |
| 5,870,272 A | | 2/1999 | Seifried et al. | 6,175,287 B1 | 1/2001 | Lampen et al. |
| 5,875,099 A | | 2/1999 | Maesaka et al. | 6,180,588 B1 | 1/2001 | Walters |
| 5,880,925 A | | 3/1999 | DuPre et al. | 6,181,231 B1 | 1/2001 | Bartilson |
| 5,889,445 A | | 3/1999 | Ritter et al. | 6,183,685 B1 | 2/2001 | Cowman et al. |
| 5,895,990 A | | 4/1999 | Lau | 6,185,091 B1 | 2/2001 | Tanahashi et al. |
| 5,898,403 A | | 4/1999 | Saitoh et al. | 6,188,565 B1 | 2/2001 | Naito et al. |
| 5,898,562 A | | 4/1999 | Cain et al. | 6,191,475 B1 | 2/2001 | Skinner et al. |
| 5,905,627 A | | 5/1999 | Brendel et al. | 6,191,669 B1 | 2/2001 | Shigemura |
| 5,907,265 A | | 5/1999 | Sakuragawa et al. | 6,191,932 B1 | 2/2001 | Kuroda et al. |
| 5,908,151 A | | 6/1999 | Elias | 6,195,269 B1 | 2/2001 | Hino |
| 5,909,155 A | | 6/1999 | Anderson et al. | 6,198,123 B1 | 3/2001 | Linder et al. |
| 5,909,350 A | | 6/1999 | Anthony | 6,198,362 B1 | 3/2001 | Harada et al. |
| 5,910,755 A | | 6/1999 | Mishiro et al. | 6,204,448 B1 | 3/2001 | Garland et al. |
| 5,912,809 A | | 6/1999 | Steigerwald et al. | 6,205,014 B1 | 3/2001 | Inomata et al. |
| 5,917,388 A | | 6/1999 | Tronche et al. | 6,207,081 B1 | 3/2001 | Sasaki et al. |
| 5,926,377 A | | 7/1999 | Nakao et al. | 6,208,063 B1 | 3/2001 | Horikawa et al. |
| 5,928,076 A | | 7/1999 | Clements et al. | 6,208,225 B1 | 3/2001 | Miller |
| 5,955,930 A | | 9/1999 | Anderson et al. | 6,208,226 B1 | 3/2001 | Chen et al. |
| 5,959,829 A | | 9/1999 | Stevenson et al. | 6,208,494 B1 | 3/2001 | Nakura et al. |
| 5,959,846 A | | 9/1999 | Noguchi et al. | 6,208,495 B1 | 3/2001 | Wieloch et al. |
| 5,969,461 A | | 10/1999 | Anderson et al. | 6,208,501 B1 | 3/2001 | Ingalls et al. |
| 5,977,845 A | | 11/1999 | Kitahara | 6,208,502 B1 | 3/2001 | Hudis et al. |
| 5,978,231 A | | 11/1999 | Tohya et al. | 6,208,503 B1 | 3/2001 | Shimada et al. |
| 5,980,718 A | | 11/1999 | Van Konynenburg et al. | 6,208,521 B1 | 3/2001 | Nakatsuka |
| 5,995,352 A | | 11/1999 | Gumley | 6,208,525 B1 | 3/2001 | Imasu et al. |
| 5,999,067 A | | 12/1999 | D'Ostillo | 6,211,754 B1 | 4/2001 | Nishida et al. |
| 5,999,398 A | | 12/1999 | Makl et al. | 6,212,078 B1 | 4/2001 | Hunt et al. |
| 6,004,752 A | | 12/1999 | Loewy et al. | 6,215,647 B1 | 4/2001 | Naito et al. |
| 6,013,957 A | | 1/2000 | Puzo et al. | 6,215,649 B1 | 4/2001 | Appelt et al. |
| 6,016,095 A | | 1/2000 | Herbert | 6,218,631 B1 | 4/2001 | Hetzel et al. |
| 6,018,448 A | | 1/2000 | Anthony | 6,219,240 B1 | 4/2001 | Sasov |
| 6,021,564 A | | 2/2000 | Hanson | 6,222,427 B1 | 4/2001 | Kato et al. |
| 6,023,406 A | | 2/2000 | Kinoshita et al. | 6,222,431 B1 | 4/2001 | Ishizaki et al. |
| 6,031,710 A | | 2/2000 | Wolf et al. | 6,225,876 B1 | 5/2001 | Akino et al. |

| | | |
|---|---|---|
| 6,226,169 B1 | 5/2001 | Naito et al. |
| 6,226,182 B1 | 5/2001 | Maehara |
| 6,229,226 B1 | 5/2001 | Kramer et al. |
| 6,236,572 B1 | 5/2001 | Teshome et al. |
| 6,240,621 B1 | 6/2001 | Nellissen et al. |
| 6,243,253 B1 | 6/2001 | DuPre et al. |
| 6,249,047 B1 | 6/2001 | Corisis |
| 6,249,439 B1 | 6/2001 | DeMore et al. |
| 6,252,161 B1 | 6/2001 | Hailey et al. |
| 6,262,895 B1 | 7/2001 | Forthun |
| 6,266,228 B1 | 7/2001 | Naito et al. |
| 6,266,229 B1 | 7/2001 | Naito et al. |
| 6,272,003 B1 | 8/2001 | Schaper |
| 6,282,074 B1 | 8/2001 | Anthony |
| 6,282,079 B1 | 8/2001 | Nagakari et al. |
| 6,285,109 B1 | 9/2001 | Katagiri et al. |
| 6,285,542 B1 | 9/2001 | Kennedy, III et al. |
| 6,292,350 B1 | 9/2001 | Naito et al. |
| 6,292,351 B1 | 9/2001 | Ahiko et al. |
| 6,309,245 B1 | 10/2001 | Sweeney |
| 6,310,286 B1 | 10/2001 | Troxel et al. |
| 6,313,584 B1 | 11/2001 | Johnson et al. |
| 6,320,547 B1 | 11/2001 | Fathy et al. |
| 6,324,047 B1 | 11/2001 | Hayworth |
| 6,324,048 B1 | 11/2001 | Liu |
| 6,325,672 B1 | 12/2001 | Belopolsky et al. |
| 6,327,134 B1 | 12/2001 | Kuroda et al. |
| 6,327,137 B1 | 12/2001 | Yamamoto et al. |
| 6,331,926 B1 | 12/2001 | Anthony |
| 6,331,930 B1 | 12/2001 | Kuroda et al. |
| 6,342,681 B1 | 1/2002 | Goldberger et al. |
| 6,373,673 B1 | 4/2002 | Anthony |
| 6,388,856 B1 | 5/2002 | Anthony |
| 6,395,996 B1 | 5/2002 | Tsai et al. |
| 6,448,873 B1 * | 9/2002 | Mostov ...................... 333/185 |
| 6,456,481 B1 | 9/2002 | Stevenson |
| 6,469,595 B2 | 10/2002 | Anthony et al. |
| 6,498,710 B1 | 12/2002 | Anthony |
| 6,504,451 B1 * | 1/2003 | Yamaguchi ................ 333/177 |
| 6,509,807 B1 | 1/2003 | Anthony et al. |
| 6,510,038 B1 | 1/2003 | Satou et al. |
| 6,522,516 B2 | 2/2003 | Anthony |
| 6,549,389 B2 | 4/2003 | Anthony et al. |
| 6,563,688 B2 | 5/2003 | Anthony et al. |
| 6,580,595 B2 | 6/2003 | Anthony et al. |
| 6,594,128 B2 | 7/2003 | Anthony |
| 6,603,646 B2 | 8/2003 | Anthony et al. |
| 6,606,011 B2 | 8/2003 | Anthony et al. |
| 6,606,237 B1 | 8/2003 | Naito et al. |
| 6,618,268 B2 | 9/2003 | Dibene, II et al. |
| 6,636,406 B1 | 10/2003 | Anthony |
| 6,650,525 B2 | 11/2003 | Anthony |
| 6,687,108 B1 | 2/2004 | Anthony et al. |
| 6,696,952 B2 | 2/2004 | Zirbes |
| 6,717,301 B2 | 4/2004 | DeDaran et al. |
| 2001/0001989 A1 | 5/2001 | Smith |
| 2001/0002105 A1 | 5/2001 | Brandelik et al. |
| 2001/0002624 A1 | 6/2001 | Khandros et al. |
| 2001/0008288 A1 | 7/2001 | Kimura et al. |
| 2001/0008302 A1 | 7/2001 | Murakami et al. |
| 2001/0008478 A1 | 7/2001 | McIntosh et al. |
| 2001/0008509 A1 | 7/2001 | Watanabe |
| 2001/0009496 A1 | 7/2001 | Kappel et al. |
| 2001/0010444 A1 | 8/2001 | Pahl et al. |
| 2001/0011763 A1 | 8/2001 | Ushijima et al. |
| 2001/0011934 A1 | 8/2001 | Yamamoto |
| 2001/0011937 A1 | 8/2001 | Satoh et al. |
| 2001/0013626 A1 | 8/2001 | Fujii |
| 2001/0015643 A1 | 8/2001 | Goldfine et al. |
| 2001/0015683 A1 | 8/2001 | Mikami et al. |
| 2001/0017576 A1 | 8/2001 | Kondo et al. |
| 2001/0017579 A1 | 8/2001 | Kurata |
| 2001/0019869 A1 | 9/2001 | Hsu |
| 2001/0020879 A1 | 9/2001 | Takahashi et al. |
| 2001/0021097 A1 | 9/2001 | Ohya et al. |
| 2001/0022547 A1 | 9/2001 | Murata et al. |
| 2001/0023983 A1 | 9/2001 | Kobayashi et al. |
| 2001/0024148 A1 | 9/2001 | Gerstenberg et al. |
| 2001/0028581 A1 | 10/2001 | Yanagisawa et al. |
| 2001/0029648 A1 | 10/2001 | Ikada et al. |
| 2001/0031191 A1 | 10/2001 | Korenaga |
| 2001/0033664 A1 | 10/2001 | Poux et al. |
| 2001/0035801 A1 | 11/2001 | Gilbert |
| 2001/0035802 A1 | 11/2001 | Kadota |
| 2001/0035805 A1 | 11/2001 | Suzuki et al. |
| 2001/0037680 A1 | 11/2001 | Buck et al. |
| 2001/0039834 A1 | 11/2001 | Hsu |
| 2001/0040484 A1 | 11/2001 | Kim |
| 2001/0040487 A1 | 11/2001 | Ikata et al. |
| 2001/0040488 A1 | 11/2001 | Gould et al. |
| 2001/0041305 A1 | 11/2001 | Sawada et al. |
| 2001/0043100 A1 | 11/2001 | Tomita et al. |
| 2001/0043129 A1 | 11/2001 | Hidaka et al. |
| 2001/0043450 A1 | 11/2001 | Seale et al. |
| 2001/0043453 A1 | 11/2001 | Narwankar et al. |
| 2001/0045810 A1 | 11/2001 | Poon et al. |
| 2001/0048581 A1 | 12/2001 | Anthony et al. |
| 2001/0048593 A1 | 12/2001 | Yamauchi et al. |
| 2001/0048906 A1 | 12/2001 | Lau et al. |
| 2001/0050550 A1 | 12/2001 | Yoshida et al. |
| 2001/0050600 A1 | 12/2001 | Anthony et al. |
| 2001/0050837 A1 | 12/2001 | Stevenson et al. |
| 2001/0052833 A1 | 12/2001 | Enokihara et al. |
| 2001/0054512 A1 | 12/2001 | Belau et al. |
| 2001/0054734 A1 | 12/2001 | Koh et al. |
| 2001/0054756 A1 | 12/2001 | Horiuchi et al. |
| 2001/0054936 A1 | 12/2001 | Okada et al. |
| 2002/0000521 A1 | 1/2002 | Brown |
| 2002/0000583 A1 | 1/2002 | Kitsukawa et al. |
| 2002/0000821 A1 | 1/2002 | Haga et al. |
| 2002/0000893 A1 | 1/2002 | Hidaka et al. |
| 2002/0000895 A1 | 1/2002 | Takahashi et al. |
| 2002/0003454 A1 | 1/2002 | Sweeney et al. |
| 2002/0005880 A1 | 1/2002 | Ashe et al. |
| 2002/0075096 A1 | 6/2002 | Anthony |
| 2003/0048029 A1 | 3/2003 | DeDaran et al. |
| 2003/0067730 A1 | 4/2003 | Anthony et al. |

FOREIGN PATENT DOCUMENTS

| | | |
|---|---|---|
| EP | 1061535 | 12/2000 |
| FR | 2765417 | 12/1998 |
| FR | 2808135 | 10/2001 |
| GB | 2217136 | 4/1988 |
| JP | 07-240651 | 9/1955 |
| JP | 63-269509 | 11/1988 |
| JP | 1-27251 | 1/1989 |
| JP | 02-267879 | 11/1990 |
| JP | 03-018112 | 1/1991 |
| JP | 5-283284 | 10/1993 |
| JP | 06-053048 | 2/1994 |
| JP | 06-053049 | 2/1994 |
| JP | 06-053075 | 2/1994 |
| JP | 06-053077 | 2/1994 |
| JP | 06-053078 | 2/1994 |
| JP | 06-084695 | 3/1994 |
| JP | 06-151014 | 5/1994 |
| JP | 06-151244 | 5/1994 |
| JP | 06-151245 | 5/1994 |
| JP | 06-325977 | 11/1994 |
| JP | 07-235406 | 9/1995 |
| JP | 07-235852 | 9/1995 |
| JP | 07-240651 | 9/1995 |

| | | |
|---|---|---|
| JP | 08-124795 | 5/1996 |
| JP | 08-163122 | 6/1996 |
| JP | 08-172025 | 7/1996 |
| JP | 09-284077 | 10/1997 |
| JP | 09-284078 | 10/1997 |
| JP | 9-294041 | 11/1997 |
| JP | 11-21456 | 8/1999 |
| JP | 11-214256 | 8/1999 |
| JP | 11-223396 | 8/1999 |
| JP | 11-294908 | 10/1999 |
| JP | 11-305302 | 11/1999 |
| JP | 11-319222 | 11/1999 |
| JP | 11-345273 | 12/1999 |
| WO | WO91/15046 | 10/1991 |
| WO | WO98/45921 | 10/1998 |
| WO | WO99/19982 | 4/1999 |
| WO | WO99/37008 | 7/1999 |
| WO | WO99/52210 | 10/1999 |
| WO | WO00/16446 | 3/2000 |
| WO | WO00/65740 | 11/2000 |
| WO | WO00/74197 | 12/2000 |
| WO | WO00/77907 | 12/2000 |
| WO | WO01/10000 | 2/2001 |
| WO | WO01/41232 | 6/2001 |
| WO | WO01/45119 | 6/2001 |
| WO | WO01/71908 | 9/2001 |
| WO | WO01/75916 | 10/2001 |
| WO | WO01/84581 | 11/2001 |
| WO | WO01/86774 | 11/2001 |
| WO | WO02/59401 | 1/2002 |
| WO | WO02/11160 | 2/2002 |
| WO | WO02/15360 | 2/2002 |
| WO | WO02/122779 | 4/2002 |
| WO | WO02/33798 | 5/2002 |
| WO | WO02/45233 | 6/2002 |
| WO | WO02/65606 | 8/2002 |
| WO | PCT/US01/48861 | 10/2002 |
| WO | WO02/080330 | 10/2002 |
| WO | PCT/US01/44681 | 1/2003 |
| WO | WO03/005541 | 1/2003 |

OTHER PUBLICATIONS

Montrose, "Analysis on Loop Area Trace Radiated Emissions from Decoupling Capacitor Placement on Printed Circuit Boards," IEEE, 1999, pp. 423–428.

Miyoshi, "Surface Mounted Distributed Constant Type Noise Filter," IEEE, 1999, pp. 157–160.

"Improved EMI Performance by Use of a Three–Terminal–Capacitor Applied to an IC Power Line," IEEE, 1999, pp. 161–164.

PCT International Search Report for PCT/US99/07653.

IPER for PCT/US99/07653.

U.S. Appl. No. 10/479,506, Claims 1–46 from Preliminary Amendment filed Dec. 10, 2003.

U.S. Appl. No. 10/189,339, Claims 1–41 from Preliminary Amendment filed Oct. 28, 2003.

U.S. Appl. No. 10/443,792, Claims 1–41 from Preliminary Amendment filed Oct. 28, 2003.

PCT International Search Report for PCT/US98/06962.

PCT International Search Report for PCT/US99/01040.

PCT International Search Report for PCT/US00/11409.

PCT International Search Report for PCT/US00/14626.

PCT International Search Report for PCT/US00/16518.

PCT International Search Report for PCT/US00/21178.

Fang et al., "Conductive Polymers Prolong Circuit Life," Design News, date unknown, 3 pages.

Carpenter, Jr. et al., "A New Approach to TVSS Design," Power Quality Assurance, Sep./Oct. 1996 pp. 60–63.

Raychem, "Polyswitch Resettable Fuses," Circuit Protection Databook, Jan., 1996, pp. 11–18.

PCT International Search Report for PCT/US01/41720.

PCT International Search Report PCT/US01/09185.

Polka et al., "Package–Level Interconnect Design for Optimum Electrical Performance," Intel Technology Journal Q3, 2000, pp. 1–17.

PCT International Search Report PCT/US01/43418.

PCT International Search Report PCT/US01/32480.

PCT International Search Report for PCT/US02/10302.

PCT International Search Report for PCT/US02/21238.

PCT International Search Report for PCT/US01/13911.

PCT International Search Report for PCT/US91/02150.

PCT International Search Report for PCT/US01/03792.

"Johanson Dielectrics, Inc. Licenses X2Y Circuit Conditioning Technology," Press Release, Dec. 16, 1998, 1 page.

Beyne et al., "PSGA –Of Record an innovative IC package for single and multichip designs," Components, Mar. 1997, pp. 6–9.

"EMC Design for Brush Commutated DC Electric Motors," Sep. 15, 1997, pp. 1–2.

"Tomorrow's Capacitors," Components, 1996, No. 4, p. 3.

Mason, "Valor –Understanding Common Mode Noise," Mar. 30, 1998, pp. 1–7.

Pending specification claims, figures for U.S. Appl. No. 10/237,079, claims 21–81; filed Sep. 9, 2002.

Pending specification, claims, figures for U.S. Appl. No. 10/766,000, claims 1–63; filed Jan. 29, 2004.

Pending specification, claims, figures for U.S. Appl. No. 10/399,630, claims 1–35; filed Aug. 27, 2003.

Pending specification, claims, figures for U.S. Appl. No. 10/432,840, claims 1–39; filed May 28, 2003.

Pending specification, claims, figures for U.S. Appl. No. 10/443,482, claims 1–25; filed Jun. 12, 2003.

Pending specification, claims, figures for U.S. Appl. No. 10/435,199, claims 1–32; filed May 12, 2003.

Pending specification, claims, figures for U.S. Appl. No. 10/115,159, claims 1–31; filed Apr. 2, 2002.

Pending specification, claims, figures for U.S. Appl. No. 10/189,338, claims 1–69; filed Jul. 2, 2002.

Pending specification, claims, figures for U.S. Appl. No. 10/189,339, claims 1–41; filed Jul. 2, 2002.

Pending specification, claims, figures for U.S. Appl. No. 10/479,506, claims 1–46; filed Dec. 10, 2003.

Pending specification, claims, figures for U.S. Appl. No. 10/443,764, claims 26–40; filed Sep. 16, 2003.

Pending specification, claims, figures for U.S. Appl. No. 10/443,792, claims 1–41; May 23, 2003.

Pending specification, claims, figures for U.S. Appl. No. 10/443,788, claims 1; 21–45; filed May 23, 2003.

Pending specification, claims, figures for U.S. Appl. No. 10/443,778, claims 1; 21–59; filed May 23, 2003.

Pending specification, claims, figures for U.S. Appl. No. 10/460,361, claims 1–16; filed Jun. 13, 2003.

Pending specification, claims, figures for U.S. Appl. No. 10/705,962, claims 1–18; filed Nov. 13, 2003.

Pending specification, claims, figures for U.S. Appl. No. 10/369,335, claims 1–20; Feb. 18, 2003.

Pending specification, claims, figures for U.S. Appl. No. 09/647,648, claims 1–48; filed Nov. 17, 2000.

Pending specification, claims, figures for U.S. Appl. No. 10/328,942, claims 1–20; filed Dec. 23, 2002.
Pending specification, claims, figures for U.S. Appl. No. 09/632,048, claims 1–20; filed Aug. 3, 2000.
Pending specification, claims, figures for U.S. Appl. No. 09/996,355, claims 1–73; filed Nov. 29, 2001.
Pending specification, claims, figures for U.S. Appl. No. 10/023,467, claims 1–20; filed Dec. 17, 2001.
Weir, et al., "DesignCon 2005, High Performance FPGA Bypass Networks".

Pending claims 1–40 and figures (3 pages) for Application No: 10/399,590; the specification is contained in WO 02/33798, filed Oct. 17, 2001, which is the published version of PCT/US01/32480, which is Neifeld Reference: X2YA0015UPCT–US, which is reference F–063 in the Information Disclosure Statement filed Apr. 23, 2004.
PCT International Search Report for PCT/US04/00218.
PCT International Search Report for PCT/US04/14539.

* cited by examiner

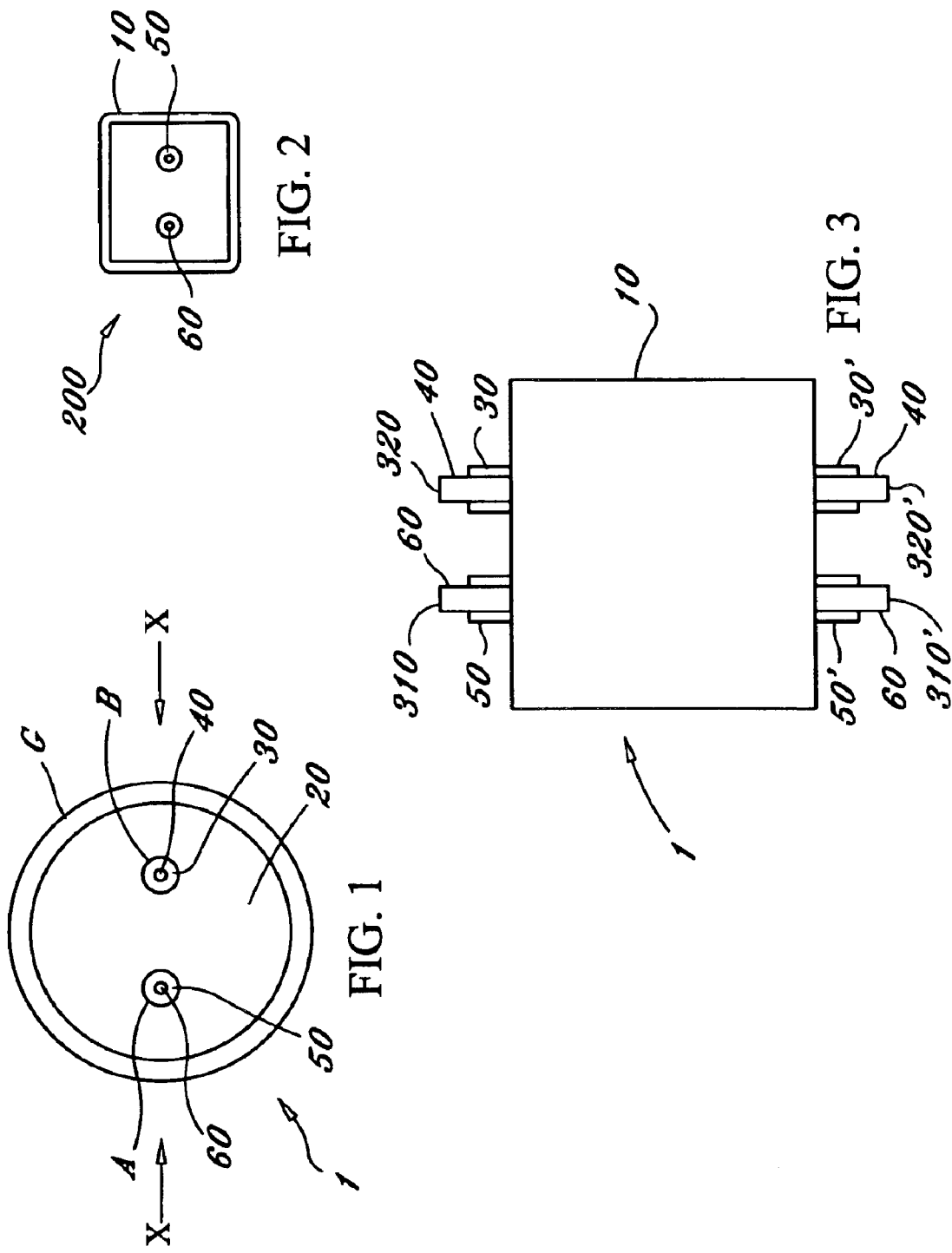

FILTER ASSEMBLY

CROSS-REFERENCE TO RELATED APPLICATIONS

This application is a continuation-in-part of application Ser. No. 10/443,764 filed Sep. 16, 2003, pending, which is a continuation of application Ser. No. 09/917,245, filed: Jul. 27, 2001, now U.S. Pat. No. 6,594,128 , which is a continuation of application Ser. No. 09/460,218 filed Dec. 13, 1999, now U.S. Pat. No. 6,331,926 , which is a continuation of application Ser. No. 09/056,379 filed Apr. 7, 1998, now issued as U.S. Pat. No. 6,018,448 , which is a continuation-in-part of application Ser. No. 09/008,769 filed Jan. 19, 1998, now issued as U.S. Pat. No. 6,097,581 , which is a continuation-in-part of application Ser. No. 08/841,940 filed Apr. 8, 1997, now issued as U.S. Pat. No. 5,909,350 , and this application claims priority to U.S. provisional applications 60/488,441, filed Jul. 21, 2003 entitled "Power Entry Assembly"; 60/500,348, filed Sep. 5, 2003 entitled "Filters and Assemblies"; 60/502,280, filed Sep. 12, 2003 entitled "SHIELDED CONNECTOR RELATED STRUCTURES"; 60/523,098, filed Nov. 19, 2003 entitled "Multi-layer Filter"; 60/527,004, filed Dec. 5, 2003 entitled "Power Entry Assembly". The contents of the foregoing applications are all incorporated herein by reference.

FIELD OF THE INVENTION

This invention relates to energy conditioning.

SUMMARY OF THE INVENTION

Objects of this invention are to provide energy filtering, energy filters, and connectors and devices that incorporate energy filters. Energy filters are also referred to as energy conditioners.

The invention provides electrical energy filters or conditioners particularly useful for power applications, circuit configurations in which they are used, methods of making the filters, and methods of using the filters. The energy filters may be included as components of connectors for electrical devices. Electrical devices are devices that include an electrical load.

In all embodiments, internal structure of the conditioner includes a G conductor, and A conductor, and a B conductor. In all embodiments, the G conductor is conductively insulated from the A and B conductors. In all embodiments, the A and B conductors are electrically isolated from one another when the filter is not connected in a circuit.

The invention provides a method of making a filter, a method of using the filter in a circuit, and a filter, wherein the filter comprises: a G conductor; an A conductor; a B conductor; wherein said G conductor, said A conductor, and said B conductor are conductively isolated from one another when said filter is not connected in a circuit; wherein said G conductor includes a G conductor central layer portion, and said G conductor central layer portion has surfaces defining a G conductor central layer first aperture and a G conductor central layer second aperture; wherein said A conductor includes an A conductor extended portion, an A conductor first layer portion, and an A conductor second layer portion; wherein said A conductor extended portion extends through said G conductor central layer first aperture; wherein said A conductor first layer portion and said A conductor second layer portion are on opposite sides of said G conductor central layer portion from one another, said B conductor includes a B conductor extended portion, a B conductor first layer portion, and a B conductor second layer portion; wherein said B conductor extended portion extends through said G conductor central layer second aperture; and wherein said B conductor first layer and said B conductor second layer portion are on opposite sides of said central layer portion from one another.

The invention also provides a method of making a filter, a method of using the filter in a circuit, and a filter, wherein the filter comprises: a G conductor; an A conductor; a B conductor; wherein said G conductor, said A conductor, and said B conductor are conductively isolated from one another when said filter is not connected in a circuit; wherein said G conductor includes a G conductor central layer portion, said G conductor central layer portion has surfaces defining a G conductor central layer first aperture and a G conductor central layer second aperture; wherein said A conductor includes an A conductor extended portion and an A conductor layer portion; wherein said A conductor layer portion includes surfaces defining an A conductor layer portion aperture; wherein said B conductor includes an B conductor extended portion and a B conductor layer portion; wherein said B conductor layer portion includes surfaces defining an B conductor layer portion aperture; wherein said A conductor extended portion extends through said G conductor central layer first aperture and said B conductor layer portion aperture; wherein said B conductor extended portion extends through said G conductor central layer second aperture and said A conductor layer portion aperture; and wherein said A conductor layer portion and said B conductor layer portion are on opposite sides of said G conductor central layer portion from one another.

Filters of the invention may be referred to as low inductance filters or non-inductive filters.

Other aspects and advantages of the invention are disclosed in conjunction with descriptions of the figures and embodiments.

BRIEF DESCRIPTION OF THE FIGURES

FIG. 1 is a top plan view of a first embodiment of a novel filter;

FIG. 2 is a top plan view of an alternative to the first embodiment;

FIG. 3 is a side view of the filter of the first embodiment;

DETAILED DESCRIPTION OF THE EMBODIMENTS

Figure 4:
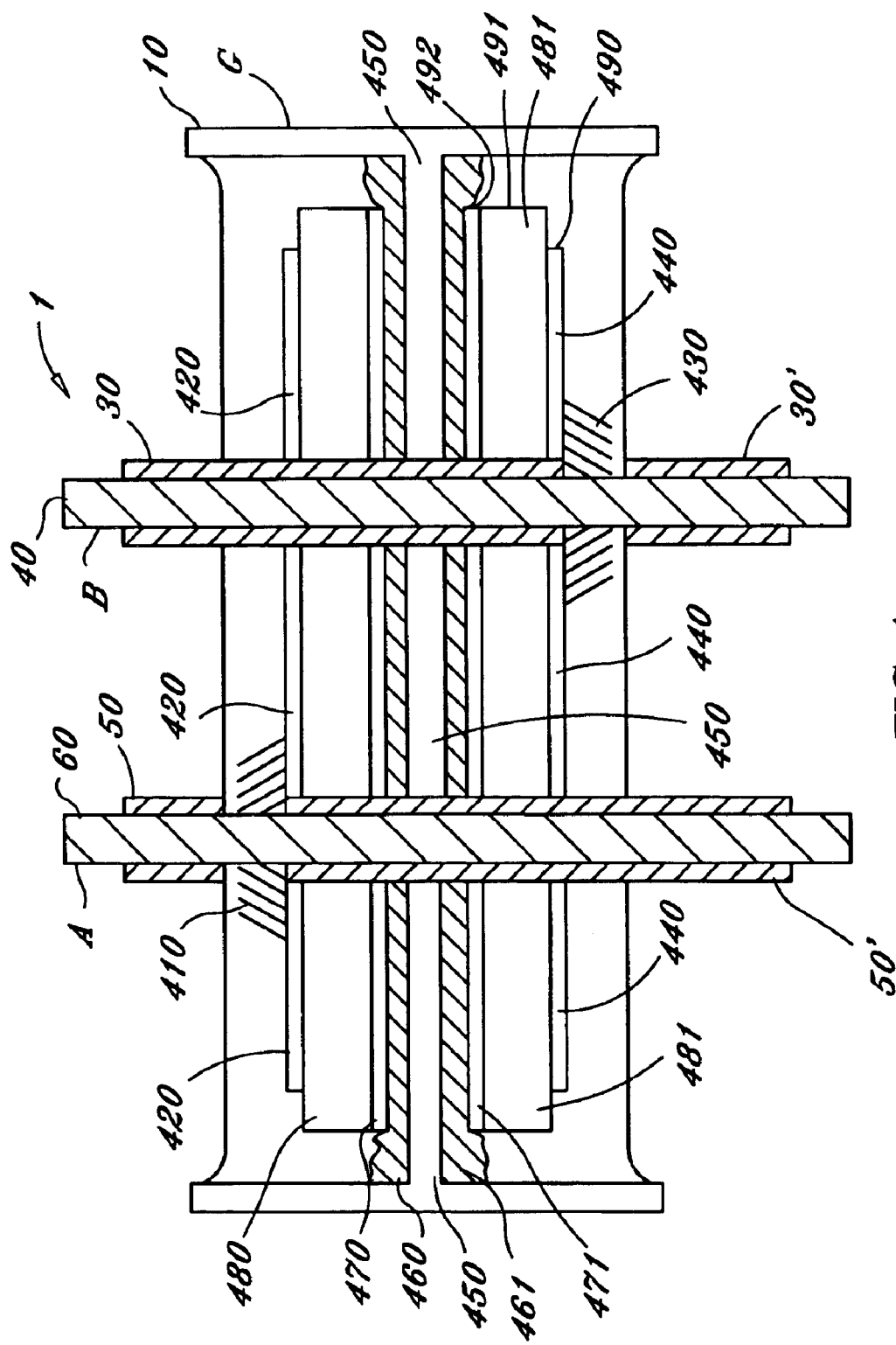
FIG. 4 is a side section view of the filter of the first embodiment along the line X—X in FIG. 1.

FIG. 1 shows an upper surface of filter 1 including conductive housing 10, dielectric 20, insulator sheath or tubing 30, conductive electrode 40, insulator tubing 50, and conductive electrode 60. Insulator 30, which may be in the form of a sheath or tubing, surrounds portions of conductive electrode 40. Insulator tubing 50 surrounds portions of conductive electrode 60. Conductive housing 10 is cylindrically shaped and surrounds dielectric 20, portions of insulator tubings 30, 50, and portions of conductive electrodes 40, 60.

Dielectric 20 may be a material used for potting electrical components. Insulator sheath or tubings 30, 50, may be heat shrink tubing.

Conductive electrodes 40, 60 are extended portions and may be referred to as metal rods, leads, wires, or pins, and may be formed for example from metals like copper or aluminum.

FIG. 2 shows an upper surface of an alternative filter 200 including conductive housing 10, and conductive electrodes 40, 60. Filter 200 has a generally rectangular perimeter. FIG. 2 illustrates that the shape of the perimeter of the conductive housing 10 and corresponding planar extent of internal components are not critical. The perimeter of conductive housing 10 has for example a generally elliptical, triangular, rectangular, pentagonal, hexagonal, octagonal, generally centrally symmetric, irregular, or similar shape.

FIG. 3 shows filter 1 including insulating tubing 30' and 50'. FIG. 3 shows that electrodes 40, 60 each have uncovered terminals 310, 310', 320, 320'. Terminals 310, 310', 320, 320' extend vertically beyond the vertical extent of housing 10 and beyond the vertical extent of dielectric 20. FIG. 3 shows insulator tubings 50, 50', 30, 30' each extending vertically beyond the vertical extent of conductive housing 10 and dielectric 20. Conductive housing 10 may be formed as a conductive coating or layer, or as a structural element.

Alternative embodiments have conductive housing 10 vertically extending beyond the vertical extent of one or more of terminals 310, 310' 320, 320', terminals 310, 310' 320, 320' having different lengths, no insulator tubing, and no dielectric 20.

Alternative embodiments have a cross-section of an external surface of conductive housing 10 partially or entirely convex, concave, or otherwise having a different extent horizontally in FIG. 3 from the extent of housing 10 at the top or bottom of housing 10.

Alternatively conductive housing 10 may only substantially cylindrically surround interior elements. That is, it may define some apertures. Alternatively, conductive housing 10 may be formed as a network or mesh of metal. Alternative embodiments have no conductive housing 10.

Alternatively, the top or the bottom or both the top and the bottom of conductive housing 10 may include a flange that extends inward towards the axis of housing 10 such that the flange partially or entirely covers a surface of dielectric 20.

Alternative embodiments have a cross section of conductive electrodes 40, 60 non-circular, for example relatively wide and flat. Wide and flat cross-sections may reduce inductance.

FIG. 4 shows internal structure of filter 1 in side section view along the line X—X in FIG. 1: FIG. 4 shows filter 1 including A conductor, B conductor, and G conductor. The A conductor includes conductive pin 60, conductive connector material region 410, and conductive layer 420. The B conductor includes conductive electrode 40, conductive connector material region 430, and conductive layer 440. The G conductor includes conductive housing 10, central conductive layer 450, conductive connector material regions 460, 461, and conductive layers 470, 471.

FIG. 4 also shows dielectric elements 480, 481 in the form of uniform thickness dielectric elements, which may be referred to as wafers.

The conductive connector materials include materials designed to provide conductive connection. Conductive connector materials include but are not limited to solders and conductive pastes. Conductive connector material regions 410, 430, 460, 461 function to provide conductive connection between adjacent conductive elements. Conductive connector material regions 460, 461 are in the form of layers, and preferably function to provide generally uniform conductive connection to adjacent conductive layers.

Conductive layer 420 of the A conductor extends around conductive pin 40 of the B conductor. Conductive layer 440 of the B electrode extends around conductive pin 60 of the A conductor. Each conductive pin 40, 60, extends through a different aperture in conductive layer 450 of the G conductor.

Insulating tubing 30 functions to conductively isolate conductive pin 40 from conductive layer 420 of the A conductor and conductive layer 450 of the G conductor. Insulating tubing 50' functions to conductively isolate conductive pin 60 from conductive layer 440 of the B conductor and conductive layer 450 of the G conductor.

In alternative embodiments, insulating tubings 30, 50' may be replaced by insulative material around only those portions of pins 40, 60 that would otherwise electrically contact other conductors than the A and B conductors respectively.

Conductive layers 440, 471, 470, and 420 are preferably formed as deposits on surfaces of dielectric elements 480, 481.

Apertures (unnumbered) through the various layers are sized to allow pins and insulating tubings to pass through.

Conductive layer 440 extends radially to an edge 490. Dielectric element 481 extends radially to an edge 491. Conductive layer 471 extends radially to edge 492. The radial extent of edge 492 exceeds the radial extent of edge 490. The radial extent of edges 491 and 492 are the same.

Alternatively, the radial extent of edge 490 may be the same as or exceed the radial extent of edge 492. Alternatively, the radial extent of edge 491 may exceed or be the same as the radial extent of both edges 490, 492.

Preferably, the conductive layers of the A conductor and the B conductor extend over at least 20 percent of the surface area inside housing 10, preferably at least 50 percent of that area, more preferably 70 percent of that area, and more preferably at least 80 percent of that area.

Preferably, the ratio of surface area of one major surface of a conductive layer of the A electrode to the total area of apertures through which electrodes 40, 60 extend is at least 2, more preferably at least 5, and more preferably at least 10.

A separation distance means the shortest distance between two objects.

Preferably, a separation distance between layers 420 and 470 is the same as a separation distance between layers 440 and 461.

Preferably, a ratio of a longest dimension in a major surface of layer 420 to a separation distance between layers 420 and 470 is at least 2, preferably at least 4, more preferably at least 8, and more preferably at least 12.

Preferably, a ratio of a longest dimension in a major surface of layer 420 to separation distance between layer 420 and housing 10 is at least 2, more preferably at least 4, and more preferably at least 8.

Alternatively, any or all of elements 460, 461, 470, and 471 maybe omitted. These conductive connector material regions or designed to provide uniform conductive connection to otherwise adjacent conductive layers. The may be omitted without changing the design of the conductive structure shown in FIG. 5. Layers 470 and 460 may be replaced by a dielectric potting material that provides a uniform dielectric interface between dielectric 480 and plate 450. Layers 461 and 471 may similarly be replaced.

Figure 5:
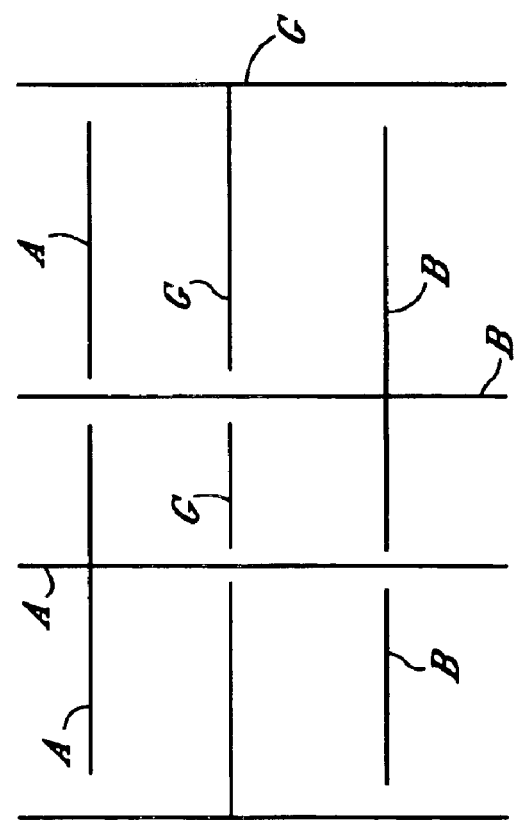
FIG. 5 is a schematic of electrically conductive structure of the side section of FIG. 4.

FIG. 5 schematically shows the conductive structure of filter 1. The conductive structure includes the A, B, and G conductors.

The G conductor includes a central layer portion and a housing portion. The housing portion is optional, but preferred. The central layer portion of the G conductor defines two apertures.

The A conductor includes a pin or feed through portion and a layer portion. The layer portion of the A conductor has one aperture.

The B conductor includes a pin or feed through portion and a layer portion. The layer portion of the B conductor has one aperture.

The A, B, and G conductors are disposed relative to one another such that the pin portion of the A conductor extends through one aperture of the G conductor and through the aperture of the B conductor, and the pin portion of the B conductor extends through the aperture in the A conductor and one aperture in the G conductor.

The A and B conductors are electrically isolated from the G conductor. When filter 1 is not connected in a circuit, the A and the B conductors are electrically isolated from one another.

Preferably, the G conductor includes the housing portion, and the housing portion of the G conductor encloses the layer portions of the A, the B conductor, and the G conductor.

Preferably, the layer portions of the A and B conductors extend across the majority of the area defined by the inner surfaces of the housing portion of the G conductor.

Preferably, layer portions of the A and B conductors have the same perimeters and only substantially differ from one another in the location of their apertures.

The two apertures in the layer portion of the G conductor through which pin portions of the A and B conductors pass may be located closer to the axial center of the housing portion and closer to one another than to the walls of the housing portion of the G conductor. Pin portions of the A and B conductors are not located so close together as to result in electrical shorting there between. How close the pin portions of the A and B conductors can be placed to one another depends upon normal anticipated operating conditions.

Alternatively, each one of the A, B, and G conductors may define additional apertures and may have variations from the geometrically flat layers and uniform thickness shown in FIGS. 4 and 5.

Alternatively, the A, B, and G conductors may have layered portions that are not flat, but instead are generally flat, such as layered portions that include steps, curves, or waves.

Alternatively, the G conductor may include a pin that passes through an aperture in the A conductor and an aperture in the B conductor. One reason for such a pin, would be to confirm the filter to the three pins typically existing in Alternating Current (AC) plugs.

In another alternative, the A and B conductors each include at least one additional conductive layer. In one structural example of this type of alternative, the left side of FIG. 4 is modified to include on top of conductive layer 420 another dielectric wafer similar in size and shape to dielectric 480, and another conductive layer (420X, not shown) similar in size and shape to layer 420 on the top thereof. In this alternative embodiment, both conductive layers 420 and 420X are conductively connected to electrode 60, for example by the presence of additional conductive connector material adjacent layer 420X, and a slight lower the top surface of dielectric 50' to allow conductive connection of layer 420 to opposing surfaces of electrode 60. Similar modifications can be made respecting the B conductor. Additional conductive layers maybe stacked upon each other in a similar fashion to layers 420, 420X, for each of the A and B conductors. In each conductive layer of the A conductor, there is an aperture allowing passage of electrode 40 of the B conductor. In each conductive layer of the B conductor, there is an aperture allowing passage of the electrode 60 of the A conductor. Dielectric sheaths 50', 30 are lengthened accordingly to account for the increased thickness of the multiple conductive layers of each of the A and B conductors.

Figure 6:
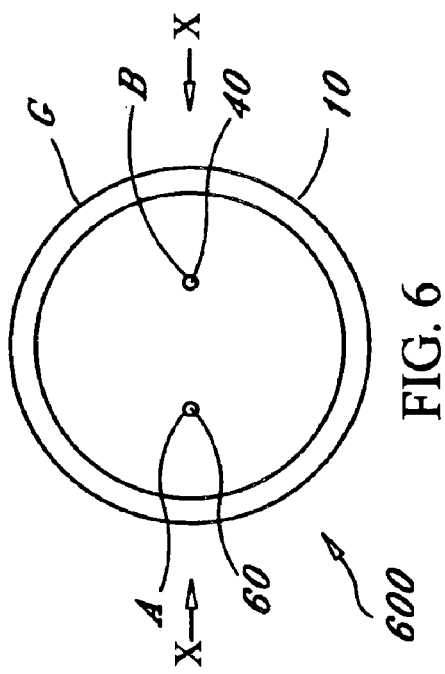
FIG. 6 is a top plan view of a second embodiment of a novel filter.

FIG. 6 shows in top plan view an upper surface of filter 600 including conductive housing 10, dielectric 20, and conductive electrodes or feed throughs 40, 60. Conductive housing 10, conductive electrode 60, and conductive electrode 40 form parts of the G, A, and B conductors respectively. Conductive housing 10 is optional, but preferred.

Figure 7:
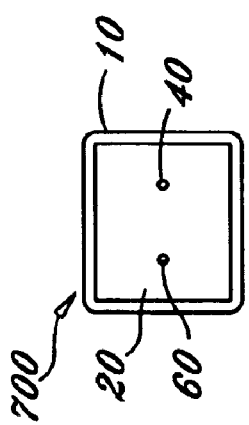
FIG. 7 is a top plan view of an alternative to the second embodiment.

FIG. 7, like FIG. 2, shows an upper surface of an alternative filter 700 including conductive housing 10, and conductive electrodes 40, 60. Filter 700 has a generally rectangular perimeter. FIG. 7 illustrates that the shape of the perimeter of the conductive housing 10 and corresponding planar extent of internal components are not critical. The perimeter of conductive housing 10 has for example a generally elliptical, triangular, rectangular, pentagonal, hexagonal, octagonal, or similar shape.

Figure 8:
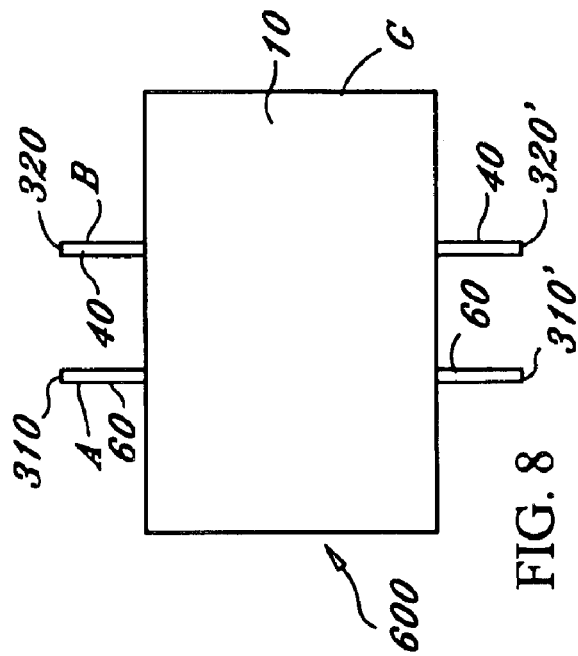
FIG. 8 is a side view of the filter of the second embodiment.

FIG. 8 shows a side view of filter 600 illustrating that conductive electrodes or feed throughs 40, 60 extend through filter 600. That is, conductive electrodes 40, 60 are in the form of a pin or rod or wire. Terminals 310, 310', 320, 320' extend vertically beyond the vertical extent of housing 10 and beyond the vertical extent of dielectric 20. Terminals 310, 310', 320, 320' are intended for connection into a circuit. They need not extend vertically relative to the dielectric or the housing so long as they can be connected into a circuit.

Figure 9:
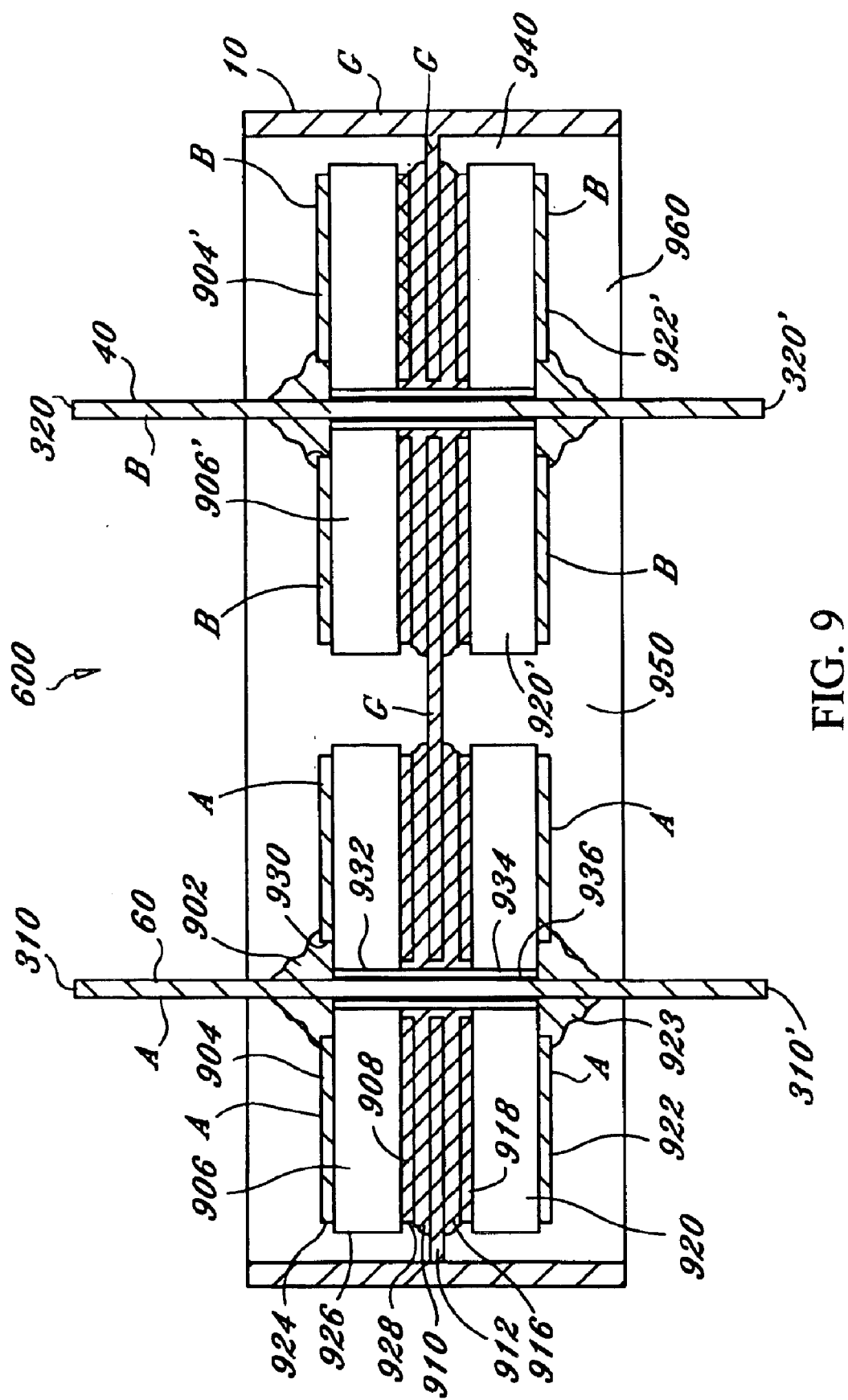
FIG. 9 is a side section view of the filter of the second embodiment along the line X—X in FIG. 6.

FIG. 9 shows a side section along the lines X—X in FIG. 6 of filter 600. Generally, FIG. 9 shows the A, B, and G conductors and certain dielectric material between them. Specifically, FIG. 9 shows conductive connector material region 902, conductive layer 904, dielectric element 906, conductive layer 908, conductive connector material region 910, conductive plate 912, conductive connector material region 916, conductive layer 918, dielectric element 920, conductive layer 922, and conductive connector material region 923. Conductive connector material region 902 conductively connects conductive element 60 to conductive layer 904. Conductive connector material region 910 conductively connects conductive layer 908 to a top side of conductive plate 912. Conductive connector material region 916 conductively connects a bottom side of conductive plate 912 to conductive layer 918. Conductive connector material region 923 conductively connects conductive element 60 to conductive layer 922. Dielectric region 934 has an outer surface 932 and an inner surface 936 facing a portion of the outer surface of conductive element 60.

Elements 908, 910, 912, 916, and 918 form part of the G conductor. Dielectric 934 covers at least that region of the surface of conductive element 60 that face elements 908, 910, 912, 916, and 918 such dielectric 934 functions to prevent electrical connection between conductive element 60 and the G conductor. Dielectric 934 may be in the form of an annular region, such as a tube shape, that surrounds a portion of conductive element 60. Preferably, dielectric 934 has an interior surface shape that conforms to the exterior surface shape of conductive element 60.

Dielectric 906 has surfaces that define an aperture through which conductive element 60 extends. Dielectric 920 also has surfaces that define an aperture through which conductive element 60 extends.

Conductive layers 904, 908, conductive plate 912, and conductive layers 918 and 922 each have surfaces defining an aperture through which conductive element 60 extends.

Preferably, all of the apertures through which conductive element 60 extends are aligned such that conductive element 60 can extend through them along a straight line.

Conductive plate 912 extends over the entire interior surface of housing 10, except that it includes one aperture through which conductive element 60 extends and another aperture through which conductive element 40 extends. Conductive plate 912 may be a separate structural element from housing 10. Conductive plate 912 may be part of an integral element including housing 10. Housing 10 is optional, but preferred.

Conductive layer 904 has left side edge 924, dielectric 906 has left side edge 926, and conductive layer 908 has left side edge 928. Left side edges 924 and 928 do not extend to the left in FIG. 9 all the way to left side edge 926. In alternative embodiments, either left side edge 924 or 928 may extend further from conductive element 60, and both left side edge 924 and left side edge 928 may extend to the left as far as left side edge 926. Left side edges 924, 928 may represent the extent of layers 904, 908 relative to edges of the major surfaces of dielectric 906 around the periphery of the major surfaces of dielectric 906.

Conductive connector material region 910 and conductive connector material region 916 preferably uniformly conductively connect surfaces of adjacent conductive layers to one another.

The structure on the right half side of FIG. 9, which includes the B conductor structure, is similar to the structure of the left half side as just described. For example, elements 906' and 920' (right hand half of FIG. 9) correspond in size, shape, and insulating properties to elements 906 and 920 (left hand half of FIG. 9).

FIG. 9 labels the various conductive elements forming each one of the A, B, and G conductor. The center of FIG. 9 shows spacing 950 between inner edges of the layers forming the A and B conductors. Spacing 950 and any dielectric material therein functions to conductively isolate layers of the A conductor from layers of the B conductor. The right side of FIG. 9 shows spacing 940 between right side edges of the layers forming the B conductor and housing 10. Spacing 940 and any dielectric material therein functions as conductive isolation between the B conductor and conductive housing 10 of the G conductor. A similar spacing exists between the conductive layers of the A conductor and the conductive housing 10. The exact shape of the major surfaces of layers 904, 922 of the A conductor are not critical. Those surfaces for example may be generally circular, rectangular, square, or other shapes.

Conductive layers 904, 922 may not be centered about conductive electrode 60. For example, conductive electrode 60 may be located near the axial center of housing 10, and conductive layers 904, 922 may be located substantially entirely to the left of conductive electrode 60. In this alternative, preferably conductive electrode 40 is also located near the axial center of housing 10 and conductive layers 904', 922' are located substantially entirely to the right of conductive electrode 40.

Preferably, layers of the A conductor (904, 922) are coplanar with corresponding layers in the B conductor (904', 922') within manufacturing tolerances.

Preferably, the shape of the major surfaces of conductive layers 904', 922' of the B conductor have the same as the shape of the major surfaces 904, 922 of the A conductor, within manufacturing tolerances. However, they may have different shapes.

Preferably, the size of the major surfaces of conductive layers 904', 922' of the B conductor are the same as the size of the major surfaces of conductive layers 904, 922 of the A conductor, within manufacturing tolerances. However, they may have different sizes from one another.

The areas and the shapes of each one of elements 904, 904', 922, and 922' may be different from one another.

Preferably, if the area of the major surfaces of conductive layers 904 and 922 are not the same as one another, then the area of the major surfaces of conductive layer 904 are the same as the area of the major surfaces of conductive layer 904', and the area of the major surfaces of conductive layer 922 are the same as the area of the major surfaces of conductive layer 922', within manufacturing tolerances. For example, if the area of a major surface of conductive layer 904 is twice the area of a major surface of conductive layer 922, then the area of a major surface of conductive layer 904' preferably is the same as an area of a major surface of conductive layer 904 and twice the area of a major surface of conductive layer 922'.

Preferably, dielectrics 906, 920, 906', 920' have the same thickness (as defined by the vertical direction in FIG. 9) as one another within manufacturing tolerances. However, the dielectrics may all have different thicknesses. Preferably, dielectrics 906, 906' have the same thickness as one another and dielectrics 920, 920 have the same thickness as one another within manufacturing tolerances.

Preferably, the size and the shape of the major surfaces of conductive layer 904 are the same as the size and the shape of the major surfaces of conductive layer 922 of the A conductor. However, those sizes may be different from one another.

Dielectric 20 is optional. However, dielectric potting helps to inhibit a flash over effect.

Preferably, the A and B conductors are disposed equidistant from an axial center of central conductive layer 912 and housing 10.

Figure 10:
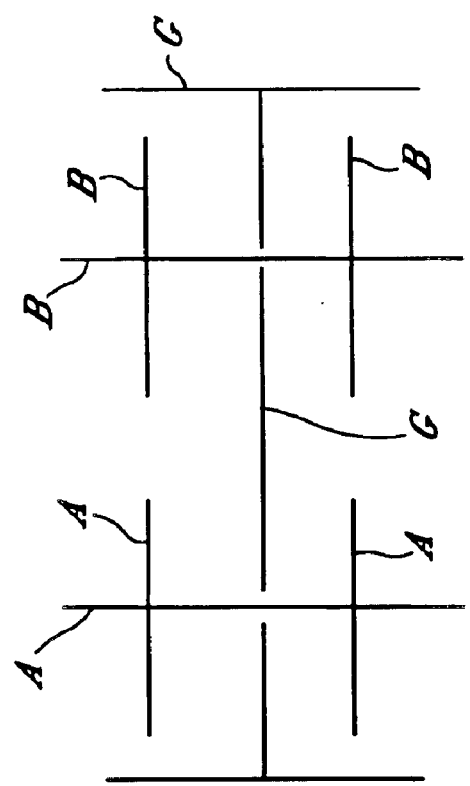
FIG. 10 is a schematic of electrically conductive structure of the side section of FIG. 9.

FIG. 10 schematically shows the conductive structure of filter 600. The conductive structure includes the A, B, and G conductors.

The G conductor includes a central layer portion and an optional housing portion. The central layer portion of the G conductor has first and second apertures.

The A conductor includes a pin portion and first and second layer portions. The pin portion of the A conductor extends through the first aperture in the central layer portion of the G conductor. The first layer portion of the A conductor and the second layer portion of the A conductor are on opposite sides of the central layer portion of the G conductor.

The B conductor includes a pin portion and first and second layer portions. The pin portion of the B conductor extends through the second aperture in the central layer portion of the G conductor. The first layer portion of the B conductor and the second layer portion of the B conductor are on opposite sides of the central layer portion of the G conductor.

Preferably, the layer portions of the A conductor do not overlap the layer portions of the B conductor.

Preferably, the area of each of the first and second apertures in the central layer portion of the G conductor is less than the area of the layered portions of the A and B conductors.

Preferably, the vertical positions of the layered portions of the A and B conductors are within the vertical extension of the housing portion of the G conductor. However, the vertical position of one or more of the layered portions of the A and B conductors may be beyond the vertical extension of the housing portion of the G conductor, or there may be no housing portion of the G conductor.

Preferably, the central layer portion of the G conductor has only the first and second apertures. However, it may have additional apertures.

Preferably, the housing portion of the G conductor and the layered portions of the A and B conductors have no apertures. However, they may have some apertures, or they may each be defined by a network of conductive elements shaped to outline the respective areas of the housing portion or layered portions.

Alternatively, the A, B, and G conductors may have layered portions that are not flat, but instead are generally flat, such as layered portions that include steps, curves, or waves.

In some embodiments of filters having the design of filter 600 and designed for 110 volt and 60 cycle applications, housing 10 is cylindrical, has a diameter of from about 1 to about 3 centimeters, and a length along the cylindrical axis of from about 1 to about 2 centimeters. Conductive layer portions of the A and B conductors each have diameters less than about half of the diameter of the housing. The distance between conductive layer portions of the A conductor are less than 2 about centimeters, and the distance between conductive layer portions of the A and B conductors is less than about 1 centimeter. However, these dimensions are not intended to imply any limits on size for any particular operating voltage.

Alternative embodiments to filter 600 have a cross-section of external surface of conductive housing 10 partially or entirely convex, concave, or otherwise having a different extent horizontally in FIG. 8 from the extent of housing 10 at the top or bottom of housing 10 in FIG. 8.

Alternatively, the top or the bottom or both the top and the bottom of conductive housing 10 may include a flange that extends inward towards the axis of housing 10 such that the flange partially or entirely covers dielectric 20.

Alternative embodiments have a cross section of conductive electrodes 40, 60 non-circular, for example relatively wide and flat. Wide and flat cross-sections may reduce inductance.

Conductive layers 904, 908, 918, and 922 are preferably formed as deposits on surfaces of dielectric elements 906, 920.

Preferably, the ratio of the sum of surface area of one major surface of layer 904 and of one major surface of layer 904' to the total cross-sectional area of the two apertures through which electrodes 40, 60 extend is at least 2, more preferably at least 5, and more preferably at least 10.

Preferably, a separation distance between layers 904 and 908 is the same as a separation distance between layers 918 and 922.

Preferably, a ratio of a longest dimension in a major surface of layer 904 to a separation distance between layers 904 and 908 is at least 2, preferably at least 4, more preferably at least 8, and more preferably at least 12.

Preferably, a ratio of a longest dimension in a major surface of layer 904 to separation distance between layer 904 and housing 10 is at least 2, more preferably at least 4, and more preferably at least 8.

Apertures (unnumbered) through the various layers are sized to allow pins and insulating tubings to pass through.

Alternatively, the G conductor may include a pin that passes through an aperture in the A conductor and an aperture in the B conductor. One reason for such a pin, would be to confirm the filter to the three pins typically existing in Alternating Current (AC) plugs.

Figure 11:
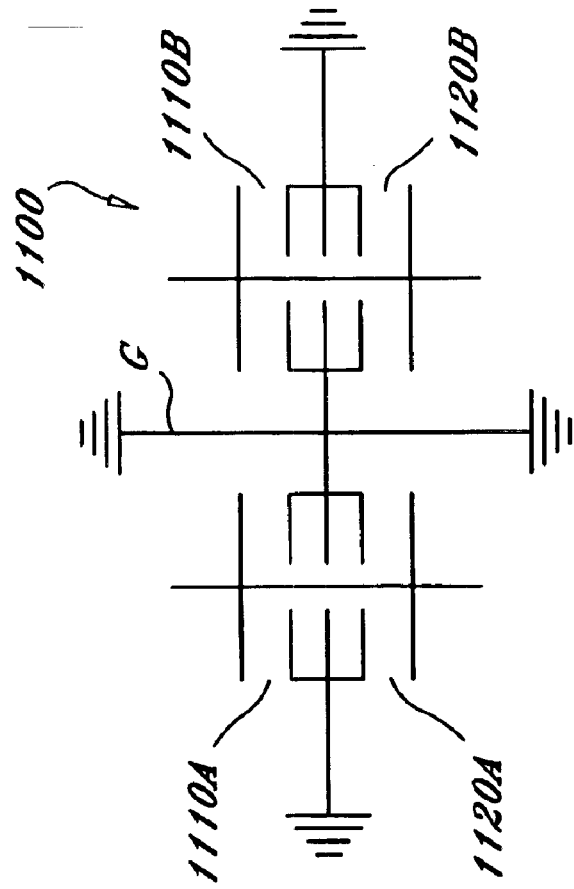
FIG. 11 is a circuit schematic modeling the filter of the second embodiment.

FIG. 11 shows a circuit schematic model 1100 of filter 600. FIG. 11 illustrates how the A, B, and G conductors are modeled as parts of circuit elements. FIG. 11 shows model 1100 including a first A capacitor 1110A, a second A capacitor 1120A, a first B capacitor 1110B, and a second B capacitor 1120B. Preferably, capacitors 1110A, 1110B have the same capacitance as one another within manufacturing tolerances, and capacitors 1120A, 1120B have the same capacitance as one another within manufacturing tolerances. Most preferably, capacitors 1110A, 1110B, 1120A, and 1120B all have the same capacitance as one another, within manufacturing tolerances.

In an alternative similar to the FIG. 9 embodiment, there exist additional conductive layers of the A conductor and additional conductive layers of the B conductor. This type of alternative embodiment has a cross-section similar to that of FIG. 9 but with the following modifications. An additional dielectric similar in cross-section to dielectric 908 reside on top of conductive layer 904. Another conductive layer similar in size and shape to conductive layer 904 (904X) resided on top of the additional dielectric. Both conductive layer 904 and 904X are conductively connected to electrode 60 of the A conductor. Similarly, and additional dielectric similar in cross-section to dielectric 920 reside under conductive layer 922, and an additional conductive layer (922X) similar in cross section to conductive layer 922 resides on the bottom surface of the additional conductive layer. Both layers 922, 922X are conductively connected to electrode 60. A similar modification may be made to the B conductor, adding an additional pair of conductive layers. Additional pairs of conductive layers may be added to each of the A and B electrodes in this fashion. While the conductive layers are similar in cross-section, they do not need to have the same thickness or surface area. All that they need to provide is an aperture through which the electrode (60 or 40) of the other of the A and B conductors may extend without conductive connection.

In all embodiments, the materials used for any or all of the dielectric elements may be materials that impart useful properties in addition to electrical insulations. For example, the dielectrics may have substantial ferro or para magnetic properties affecting inductance, or varistor properties affecting voltage response. For example, metal oxide varistor MOV materials may be useful for surge protection. Ferro electric materials may also be useful to provide charge related effects.

In all embodiments, the G conductor is conductively isolated from the A and B conductors. In all embodiments, when the filter is not connected in a circuit, the A and B conductors are conductively isolated from one another.

Figure 12:
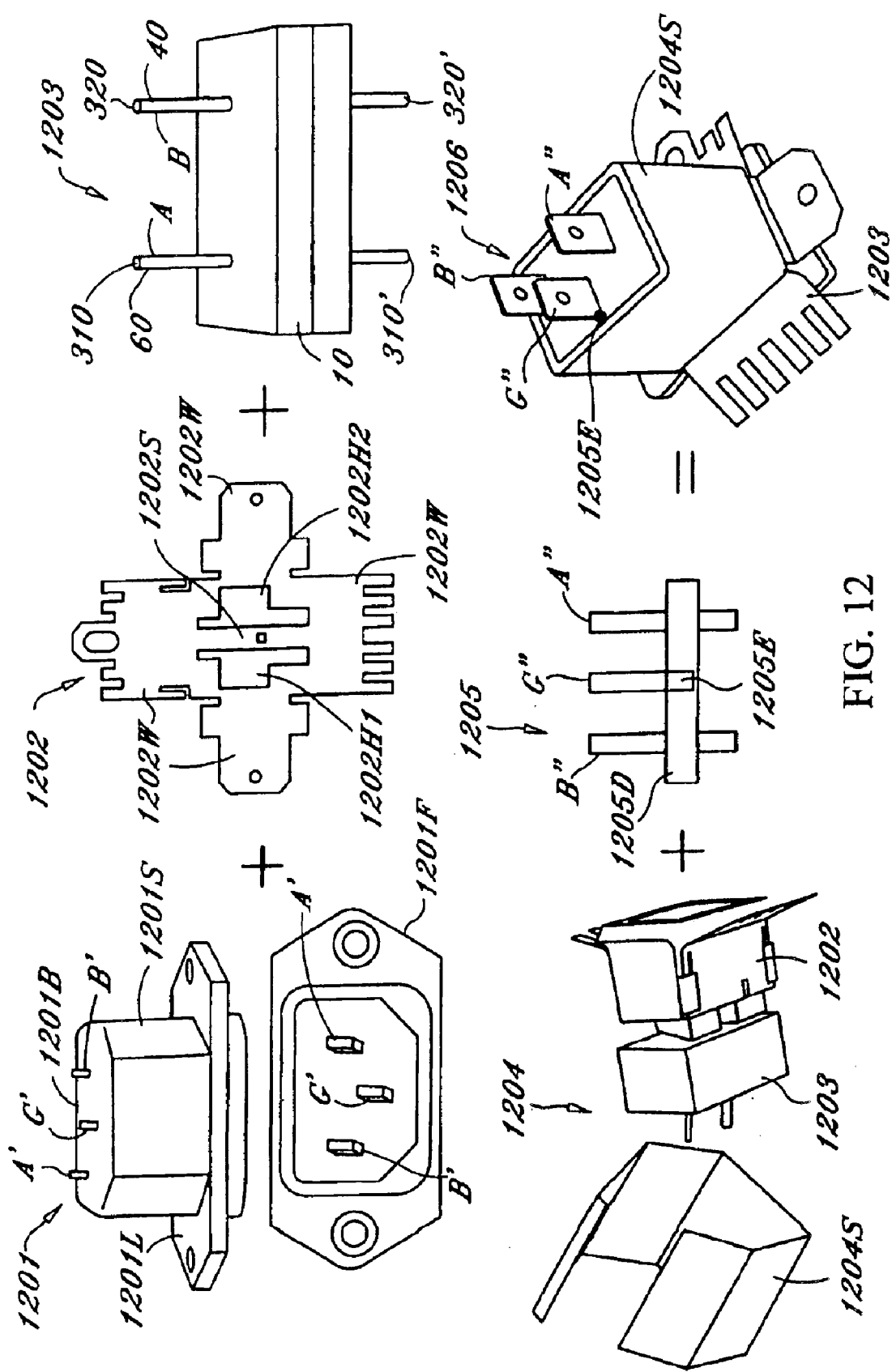
FIG. 12 is a schematic composite illustrating an assembly of a filter assembly including a novel filter of the foregoing embodiments.

FIG. 12 is a composite of images of components useful for explaining steps in assembly of a connector including a filter. FIG. 12 shows two views of a plug base 1201, showing plug base back side 1201B and plug base front side 1201F. Plug base 1201 also shows plug base side surface 1201S, plug base lip 1201L, and rear terminals of plug conductive ground pin G', plug conductive pins A', and plug conductive pin B'.

Conductive inner shield 1202 is conductive and wraps onto plug base 1201 such that inner shield strap 1202S overlaps and contacts the center pin (ground pin) and inner shield side wall portions 1202W generally conform to plug base side surfaces 1201 S and plug base lip 1201L.

Filter 1203 includes electrodes 60, 40, and preferably housing 10. Electrode 60 has terminals 310, 310'. Electrode 40 includes terminals 320, 320'. Filter 1203 is assembled to plug base back side 1201B by connecting terminals 310 of the A conductor to the rear terminal of plug conductive pin A' of the plug base, connecting terminal 320 of the B conductor to the rear terminal of plug conductive pin B'. In this assembly, electrode pin 60 extends through hole 1202H1 in inner shield 1202, electrode pin 40 extends through the hole 1202H2 in inner shield 1202 such that pins 40, 66 remain conductively isolated from conductive inner shield 1202.

In this embodiment the G conductor has no pin. Thus, no pin of a filter connects to the rear terminal of plug conductive groung pin G'. In embodiments in which the filter's G connector has terminals, one terminal may connect to inner shield strap 1202S and/or directly to the rear terminal of plug conductive groung pin G'.

Assembly 1204 shows conductive outer shield 1204S which wraps around the assembly of filter 1203, inner shield 1202, plug base 1201, and back side filter pin assembly 1205 to form filter assembly 1206. Conductive outer shield 1204S and inner shield 1202 are physically connected to each other and therefore conductively connected, conductive outer shield 1204S is physically connected to housing 10 and therefore conductively connected to housing 10, and therefore, the G' electrode, the conductive inner shield, the conductive outer shield, and the G conductor are electrically conductively connected to one another.

Back side filter pin assembly includes a dielectric frame 1205D holding conductor back side electrodes G", A", and B". During assembly, conductor back side pins A" and B" are electrically connected to the corresponding filter electrodes A and B, and the G" pin is physically and conductively connected to conductive outer shield 1204S, such as via conductive extension 1205E and solder.

When assembled, strap 1202S passes between the pin portions 60, 40 of the A and B conductors, contacts the ground pin of the plug base, and also electrically connects through the outer shield to the G conductor.

In one alternative embodiment, an additional conductive strap portion completes a loop with strap 1202S around the back side of filter 1203 between the pin portions 60, 40 extending on the opposite side of the filter. That is the additional conductive strap portion connects on each side of the filter to strap 1202S such that the strap 1202S and the additional conductive strap form a conductive loop around filter 1203 extending between contacts 310, 320, and also extending between contacts 310', 320'.

FIG. 12 is exemplary of one assembly of a filter in a connecter. The filters disclosed herein may be incorporate in virtually any connector, in connectors forming part of extension cords, electrical appliances, electronic devices, electrical and electronic consumer goods, including digital electronics like computer, servers, printer, network devices, and including consumer electronics such as motorized equipment, televisions, radio, kitchen machinery, refrigerators, transportation equipment, like automobiles, trucks, boats, airplanes, and trains, and the like. These connectors may have two, three, or more than connector three electrodes or male or female pins, and may or may not have a ground line. The conductors may be designed for low power digital application, conventional utility power as noted above, or specialty and high voltage and frequency power.

Figure 13:
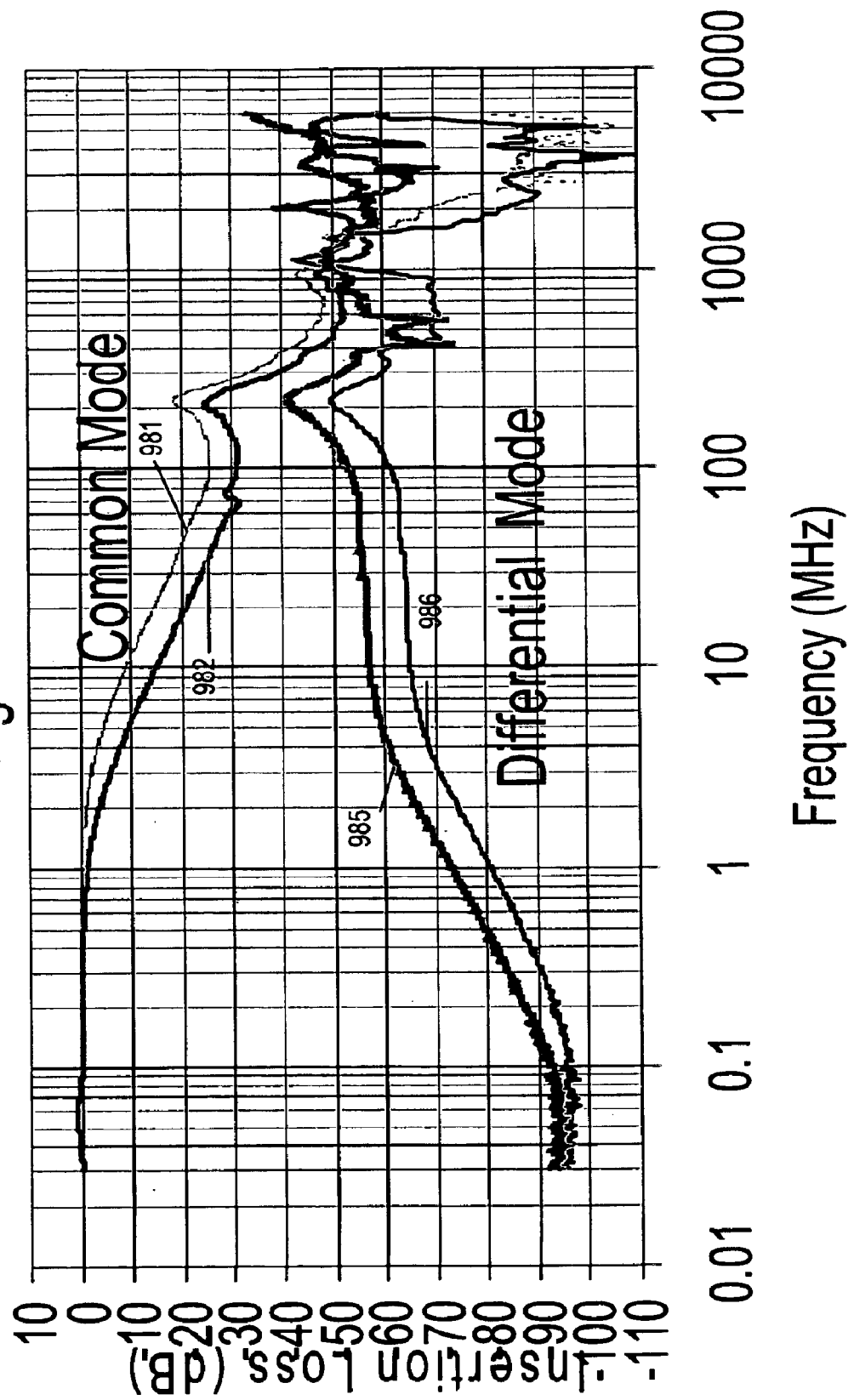
FIG. 13 is a graph showing test data for insertion loss versus frequency through various ports of the shielded and unshielded filters.

FIG. 13 contains performance curves of a device having the structure of the FIG. 6 embodiment when connected in different configurations and with and with out shielding. The top two curves represent the Common Mode insertion loss versus frequency. Common mode refers to signal passing between two ends of one electrode, such as ends 310, 310'. Curve 981 represents the performance of a single line 310 to 310' or 320 to 320' with and without shielding. Curve 982 shows the common mode performance of paired lines 310+320 to 310'+320' shielded.

The lower two curves represent the Differential Mode insertion loss versus frequency. Differential mode refers to signal passing between two ends of different electrode, such as ends 310, 320'. Curve 985 represents the performance of an unshielded assembly after connecting 310 to one line and 320' to another line with a ground connection established. Curve 986 represents the performance of a shielded assembly after connecting 310 to one line and 320' to another line with a ground connection established The shielding effectiveness is more apparent in the differential curves, 8 to 10 dB improvement in the lower frequency ranges up to 1.5 Giga Hertz (GHz) then typically more than 30 dB improvement from 1.5 GHz to 6.0 Ghz.

Common mode shows insertion loss greater than 20 Db at 100 Mega Hertz (MHz), and insertion loss greater than 30 Db and greater than 40 Db at 1 GHz. Differential mode shows insertion loss greater than 50 Db up to about 100 MHz, and insertion loss greater than 30 Db from DC to 6.0 Ghz.

FIG. 12 illustrates a connector including a novel filter. The novel filters disclosed herein are suitable for inclusion in any type of electrical connector. The novel filters disclosed herein are also suitable for insertion in lines in a circuit in the configurations noted above, whether as part of a combination filter integrated into a connector as a filter not integrated into a connector.

In operation of any filter of the invention, contacts of the A and B pins are connected into a circuit, the G conductor either remains isolated or is connected to a substantial capacitance or is connected to a system ground.

In a first circuit configuration, terminals at one end of a filter, such as terminals 310, 320 are both electrically connected to one another and terminals 310,m 320' are connected together, and the filter is inserted in series in a first line between a source of power and a load. Alternatively, more than one filter may be inserted in series, and filters may be inserted along both source and return lines.

In a second circuit configuration, the A conductor (pin 60) is connected in series along a first line between a source of power and a load, and the B conductor (pin 40) is connected in series along a second line between the source of power and the load.

In either circuit, the G conductor is either floating, connected to a substantial capacitance, or connected to a system ground. The G conductor can be conductively connected to a conductive area not integral of the filter in order to provide source or sink of charge.

In operation, power is applied from the source to the load, and the filter or filters function to reduce common mode noise and differential mode noise.

The source may be nominal 110 Volt 50–60 cycle or 208, 220, 230 or the like Volt and 50–60 cycle power, or any other voltage, phase, and frequency source. The load may be any electrical device using such power.

The source may also be a battery, such as a 12 volt battery, such as a battery used to provide electrical power in a car, the source may be an alternator in a vehicle. The load may be any and all electrical devices including motors and electronics operating off such sources.

FIG. 13 is a graph showing attenuation versus frequency data for an embodiment of filter 600. FIG. 13 shows attenuation versus frequency for common mode insertion loss and differential mode insertion loss.

Common mode refers to attenuation across the two terminals of either conductor pin 60 or conductor pin 40. That is, either attenuation across terminals 310 and 310' or attenuation across terminals 320, 320.

Differential mode means attenuation from a terminal of conductor pin 60 on one side of the filter to the terminal of conductor pin 40 on the other side of the filter. That is, attenuation for example across terminals 310 and 320'.

The top two curves 981, 982 represent Common Mode insertion loss. Curve 981 represents the performance of a single line 310 to 310' or 320 to 320' with and without shielding. Curve 982 shows the common mode performance of paired lines 310+320 to 310'+320' shielded.

The lower two curves 985, 986 represent the Differential Mode insertion. Curve 985 represents the performance of a unshielded assembly for measurements acquired after connecting 310 to one line and 320' to another line with a ground connection established. Curve 986 represents the performance of a shielded assembly for measurements acquired after connecting 310 to one line and 320' to another line with a ground connection established. The shielding effectiveness is more apparent in the differential curves, showing 8 to 10 dB improvement in the frequency ranges up to 1.5 Giga Hertz (GHz) then typically more than 30 dB improvement from 1.5 GHz to 6.0 GHz.

Common mode attenuation is greater than 20 Db at 100 Mega Hertz (MHz), and greater than 40 Db at 1 GHz. Differential mode attenuation is greater than 50 Db below 100 MHz, and greater than 40 Db at 1.5 Ghz.

The current carrying capability of filters of the invention are the same as current carrying capabilities of conductive wires having the same cross sectional area and conductivity of wires as conductive elements 60, 40, and filters of the invention function without inductive elements. As a result, filters of the invention are generally smaller than prior art filters of the type that included inductive elements. Due to the lack of inductive elements, filters of the invention may also dissipate less energy into heat during use than prior art filters of the type including inductive elements.

The current carrying capabilities of wires are specified by the national electrical code. According to the Handbook of Chemistry and Physics, 58th edition, page F-163: the current carrying capacity of 16 gauge solid copper wire is 10 Amperes, and that wire has a diameter of 50.8 mils and a cross-sectional area of 2583 square mils, which is about 1.7 square millimeters; the current carrying capacity of 14 gauge solid copper wire is 20 Amperes, and that wire has a diameter of 64.1 mils and a cross-sectional area of 4107 square mils, which is about 2.6 square millimeters; and the current carrying capacity of 12 gauge solid copper wire is 30 Amperes, and that wire has a diameter of 80.8 mils and a cross-sectional area of 6530 mils, which is about 4.2 square millimeters.

Accordingly, a filter of the invention having conductive elements or pins 60, 40 having a cross-section as small as 1.7 square millimeters has a current carrying capacity of about 10 amps; pin 60, 40 having a cross-section as small as 2.6 square millimeters has a current carrying capacity of about 20 amps; and pin 60, 40 having a cross-section as small as 4.2 square millimeters has a current carrying capacity of about 30 amps.

One method of fabricating an assembly used to make filters of the invention is to deposit conductive layers on opposite sides of a generally planar dielectric. The generally planar dielectric may have the form of dielectric element 480 or dielectric element 906, or may subsequently be cut or formed to the shape of these dielectric elements. The deposited conductive layers may have the form for example of conductive layers 904 and 908, as deposited, or they may be formed to the shape of conductive layers 904, 908, after the deposition. In any case, the method of fabrication preferably includes forming dielectric wafers subsequently used as dielectric elements having a deposited conductive layer on each side thereof, and then providing conductive connector material to conductively connect components of the A conductor to one another, to conductively connect components of the B conductor to one another, and to conductively connect components of the G conductor to one another.

The method of manufacturing filters of the invention are limited to mechanical assembly of discrete components. The inventors conceive of fabrication alternatively including depositing a sequence of layers forming the layered structures of the filters, patterning the layered structures and/or machining the deposited layered structures, to form any sub set or an entire sequence of the layers of a filter, and depositing or mechanically assembling an optional housing.

The foregoing embodiments and descriptions are exemplary and are not intended to be limiting. The scope of the invention is defined by the following claims.

What is claimed is:

1. A filter comprising:
   a G conductor;
   an A conductor;
   a B conductor;
   wherein said G conductor, said A conductor, and said B conductor are conductively isolated from one another when said filter is not connected in a circuit;
   wherein said G conductor includes a G conductor central layer portion, and said G conductor central layer portion has surfaces defining a G conductor central layer first aperture and a G conductor central layer second aperture;

wherein said A conductor includes an A conductor extended portion, an A conductor first layer portion, and an A conductor second layer portion;

wherein said A conductor extended portion extends through said G conductor central layer first aperture;

wherein said A conductor first layer portion and said A conductor second layer portion are on opposite sides of said G conductor central layer portion from one another, said B conductor includes a B conductor extended portion, a B conductor first layer portion, and a B conductor second layer portion;

wherein said B conductor extended portion extends through said G conductor central layer second aperture; and wherein said B conductor first layer and said B conductor second layer portion are on opposite sides of said central layer portion from one another.

2. The filter of claim 1 wherein said G conductor comprises a housing portion.

3. The filter of claim 1 wherein said G conductor comprises a housing portion and said housing portion extends through a plane through said A conductor first layer protion.

4. The filter of claim 1 wherein said G conductor comprises a housing portion and said housing portion encloses said A conductor first layer portion, said A conductor second layered portion, said B conductor first layer portion, and said B conductor second layer portion.

5. The filter of claim 1 wherein said G conductor comprises a housing portion and said housing comprises at least one flange portion.

6. The filter of claim 1 further comprising conductive connector material.

7. The filter of claim 1 further comprising a first dielectric material.

8. The filter of claim 1 further comprising a first dielectric material and a second dielectric material.

9. The filter of claim 1 wherein said A conductor and said B conductor have about the same shape.

10. The filter of claim 1 wherein a shape of a major surface of said A conductor first layer portion is one of generally circular, generally rectangular, and generally square.

11. The filter of claim 1 wherein said A conductor first layer portion is not centered about said A conductor extended portion.

12. The filter of claim 1 wherein said G conductor further comprises a housing and said a separation distance between said A conductor extended portion and said B conductor extended portion is less than a separation distance between said A conductor and said housing.

13. The filter of claim 1 wherein said A conductor first layer portion and said B conductor first layer portion are coplanar.

14. The filter of claim 1 wherein an area of a major surface of said A conductor first layer portion is different from an area of a major surface of said A conductor second layer portion.

15. The filter of claim 1 wherein said A conductor first layer portion does not overlap any layer portion of said B conductor.

16. The filter of claim 1 wherein said G conductor central layer first aperture has a G conductor central layer first aperture area, a major surface of said A conductor first layer portion has an A conductor first layer portion area, and said A conductor first layer portion area is greater than said G conductor aperture area.

17. The filter of claim 1 wherein said G conductor central layer portion has no surfaces defining apertures other than said G conductor central layer first aperture and said G conductor central layer second aperture.

18. The filter of claim 1 wherein said G conductor central layer portion, said A conductor first layered portion, said A conductor first layer portion, said A conductor second layer portion, said B conductor first layer portion, and said B conductor second layer portion are flat.

19. The filter of claim 1 wherein a ratio of a longest distance in said A conductor first layered portion to a separation distance between said A conductor first layer portion and said A conductor second layer portion is at least 2.

20. The filter of claim 1 wherein said G conductor includes a housing portion, and a ratio of a longest distance in said A conductor first layered portion to a separation distance between said A conductor first layer portion and said housing portion is at least 2.

21. A circuit comprising the filter of claim 1 further comprising:

a source of power;

a load;

wherein said A conductor extended portion is inserted in series along one line between said source and said load and said B conductor extended portion is inserted in series along another line between said source and said load.

22. A circuit comprising the filter of claim 1 further comprising:

a source of power;

a load;

wherein said A conductor extended portion has a first end, said B conductor extended portion has a first end, and the first ends of the A conductor and B conductor are conductively connected to form a filter first terminal, second ends of said A conductor extended portion and said B conductor extended portion are conductively connected to form a filter second terminal, and said filter first terminal and said filter second terminal are inserted in series along a line between said source and said load.

23. A connector comprising the filter of claim 1, wherein said connector comprises a ground pin connecting to a first ground strap and said G conductor, a second connector pin;

a third connector pin;

and wherein said ground strap extends between said A conductor extended portion and said B conductor extended portion.

24. The connector of claim 23 further comprising a second ground strap forming with said first ground strap a loop around said filter such that said loop extends between said A conductor extended portion and said B conductor extended portion on opposite sides of said filter.

25. The connector of claim 23 wherein no ground pin extends into said filter structure.

26. The connector of claim 23 wherein a cross-sectional area of said A conductor extended portion is not greater than a cross-sectional area of said first connector pin.

27. The connector of claim 26 wherein said A conductor extended portion has a cross-sectional diameter of not more than about 2.6 square millimeters.

28. A filter of claim 1 incorporated into anyone of an extension cord, an electrical appliances, an electronic devices, an electronic consumer good, a digital electronic computer, a server, a printer, a network device, a motorized equipment, a television, a radio, a kitchen machine, a refrigerator, a automobile, a truck, a boat, an airplane, and a train.

29. A connector of claim 23 incorporated into any one of an extension cord, an electrical appliances, an electronic devices, an electronic consumer good, a digital electronic computer, a server, a printer, a network device, a motorized equipment, a television, a radio, a kitchen machine, a refrigerator, a automobile, a truck, a boat, an airplane, and a train.

30. A connector of claim 23 having more than three male or female pins.

31. A connector of claim 23 designed for at least one of low power digital, conventional utility power, high voltage, and high frequency applications.

32. A method of making a filter comprising:
providing a G conductor;
providing an A conductor;
providing a B conductor;
wherein said G conductor, said A conductor, and said B conductor are conductively isolated from one another when said filter is not connected in a circuit;
wherein said G conductor includes a G conductor central layer portion, and said G conductor central layer portion has surfaces defining a G conductor central layer first aperture and a G conductor central layer second aperture;
wherein said A conductor includes an A conductor extended portion, an A conductor first layer portion, and an A conductor second layer portion;
wherein said A conductor extended portion extends through said G conductor central layer first aperture;
wherein said A conductor first layer portion and said A conductor second layer portion are on opposite sides of said G conductor central layer portion from one another,
said B conductor includes a B conductor extended portion, a B conductor first layer portion, and a B conductor second layer portion;
wherein said B conductor extended portion extends through said G conductor central layer second aperture; and
wherein said B conductor first layer and said B conductor second layer portion are on opposite sides of said central layer portion from one another.

33. The method of making a connector comprising the method of claim 32 and further comprising incorporating said filter into a connector structure.

34. A method of using a filter, said filter comprising:
a G conductor;
an A conductor;
a B conductor;
wherein said G conductor, said A conductor, and said B conductor are conductively isolated from one another when said filter is not connected in a circuit;
wherein said G conductor includes a G conductor central layer portion, and said G conductor central layer portion has surfaces defining a G conductor central layer first aperture and a G conductor central layer second aperture;
wherein said A conductor includes an A conductor extended portion, an A conductor first layer portion, and an A conductor second layer portion;
wherein said A conductor extended portion extends through said G conductor central layer first aperture;
wherein said A conductor first layer portion and said A conductor second layer portion are on opposite sides of said G conductor central layer portion from one another;
said B conductor includes a B conductor extended portion, a B conductor first layer portion, and a B conductor second layer portion;
wherein said B conductor extended portion extends through said G conductor central layer second aperture;
wherein said B conductor first layer and said B conductor second layer portion are on opposite sides of said central layer portion from one another;
filtering electrical energy with said filter.

35. The method of claim 34 wherein said filter is integrated into a connector.

36. The method of claim 35 further comprising connecting the connector.

37. A filter comprising:
a G conductor;
an A conductor,
a B conductor;
wherein said G conductor, said A conductor, and said B conductor are conductively isolated from one another when said filter is not connected in a circuit;
wherein said G conductor includes a G conductor central layer portion, said G conductor central layer portion has surfaces defining a G conductor central layer portion first aperture and a G conductor central layer portion second aperture;
wherein said A conductor includes an A conductor extended portion and an A conductor layer portion;
wherein said A conductor layer portion includes surfaces defining an A conductor layer portion aperture;
wherein said B conductor includes a B conductor extended portion and a B conductor layer portion;
wherein said B conductor layer portion includes surfaces defining an B conductor layer portion aperture;
wherein said A conductor extended portion extends through said G conductor central layer portion first aperture and said B conductor layer portion aperture;
wherein said B conductor extended portion extends through said G conductor central layer portion second aperture and said A conductor layer portion aperture; and
wherein said A conductor layer portion and said B conductor layer portion are on opposite sides of said G conductor central layer portion from one another.

38. The filter of claim 37 wherein said G conductor comprises a housing portion.

39. The filter of claim 37 wherein said G conductor comprises a housing portion and said housing portion extends through a plane through said A conductor first layer portion.

40. The filter of claim 37 wherein said G conductor comprises a housing portion and said housing portion encloses said A conductor layer portion and said B conductor layer portion.

41. The filter of claim 37 wherein said G conductor comprises a housing portion and said housing comprises at least one flange portion.

42. The filter of claim 37 further comprising conductive connector material.

43. The filter of claim 37 further comprising a first dielectric material.

44. The filter of claim 37 further comprising a first dielectric material and a second dielectric material.

45. The filter of claim 37 wherein said A conductor and said B conductor have about the same shape.

46. The filter of claim 37 wherein a shape of a major surface of said A conductor layer portion is one of generally circular, generally rectangular, and generally square.

47. The filter of claim 37 wherein said G conductor includes a housing portion, said housing portion having a housing portion interior surface, said A conductor layer portion is inside said housing portion, and a perimeter of said A conductor layer portion conforms in shape to said housing portion interior surface.

48. The filter of claim 37 wherein said A conductor extended portion has a wide and flat cross-section and said B conductor extended portion has a wide and flat cross-section.

49. The filter of claim 37 wherein said G conductor comprises a housing portion, interior surfaces of said housing portion define a housing portion interior cross-sectional area, and said A conductor layer portion extends over a majority of said housing portion interior cross-sectional area.

50. The filter of claim 37 wherein said G conductor central layer portion first aperture has a G conductor central layer portion first aperture area, a first major surface of said A conductor layer portion has an A conductor layer portion first major area, and a ratio of said A conductor layer portion first major area to said G conductor central layer portion first aperture area is greater than 2.

51. The filter of claim 37 wherein a separation distance between said A conductor layer portion and said G conductor central layer portion is substantially the same as a separation distance between said B conductor layer portion and said G conductor central layer portion.

52. The filter of claim 37 wherein a ratio of longest dimension in a major surface of said A conductor layer portion to a separation distance between said A conductor layer portion and said G conductor central layer portion is at least 2.

53. The filter of claim 37 wherein said G conductor comprises a housing portion, and a ratio of longest dimension in a major surface of said A conductor layer portion to a separation distance between said A conductor layer portion and housing portion is at least 2.

54. The filter of claim 37 wherein said A conductor layer portion and said B conductor layer portion have substantially the the size and shape.

55. The filter of claim 37 wherein said G conductor includes a housing portion, and a separation distance between said A conductor extended portion and said B conductor extended portion is less than a separation distance between said A conductor extended portion and said housing portion.

56. The filter of claim 37 wherein said G conductor central layer portion has surfaces defining no other apertures in addition to said G conductor central layer portion first aperture and said G conductor central layer portion second aperture, said A conductor has surfaces defining no other apertures than said A conductor layer portion aperture, and said B conductor has surfaces defining no other apertures than said B conductor layer portion aperture.

57. The filter of claim 37 wherein said G conductor central layer portion, said A conductor layer portion, and said B conductor layer portion are flat.

58. A circuit comprising the filter of claim 37 further comprising:
a source of power;
a load;
wherein said A conductor extended portion is inserted in series along one line between said source and said load and said B conductor extended portion is inserted in series along another line between said source and said load.

59. A circuit comprising the filter of claim 37 further comprising:
a source of power;
a load;
wherein said A conductor extended portion has a first end, said B conductor extended portion has a first end, and the first ends of the A conductor and B conductor are conductively connected to form a filter first terminal, second ends of said A conductor extended portion and said B conductor extended portion are conductively connected to form a filter second terminal, and said filter first terminal and said filter second terminal are inserted in series along a line between said source and said load.

60. A connector comprising the filter of claim 37, wherein said connector comprises a ground pin connecting to a first ground strap and said G conductor;
a second connector pin;
a third connector pin;
and
wherein said ground strap extends between said A conductor extended portion and said B conductor extended portion.

61. The connector of claim 60 further comprising a second ground strap forming with said first ground strap a loop around said filter such that said loop extends between said A conductor extended portion and said B conductor extended portion on opposite sides of said filter.

62. The connector of claim 60 wherein no ground pin extends into said filter structure.

63. The connector of claim 60 wherein a cross-sectional area of said A conductor extended portion is not greater than a cross-sectional area of said first connector pin.

64. The connector of claim 63 wherein said A conductor extended portion has a cross-sectional diameter of not more than about 2.6 square millimeters.

65. A filter of claim 37 incorporated into any one of an extension cord, an electrical appliances, an electronic devices, an electronic consumer good, a digital electronic computer, a server, a printer, a network device, a motorized equipment, a television, a radio, a kitchen machine, a refrigerator, a automobile, a truck, a boat, an airplane, and a train.

66. A connector of claim 60 incorporated into anyone of an extension cord, an electrical appliances, an electronic devices, an electronic consumer good, a digital electronic computer, a server, a printer, a network device, a motorized equipment, a television, a radio, a kitchen machine, a refrigerator, a automobile, a truck, a boat, an airplane, and a train.

67. A connector of claim 60 having more than three male or female pins.

68. A connector of claim 60 designed for at least one of low power digital, conventional utility power, high voltage, and high frequency applications.

69. A method of making a filter comprising:

providing a G conductor;

providing an A conductor;

providing a B conductor;

wherein said G conductor, said A conductor, and said B conductor are conductively isolated from one another when said filter is not connected in a circuit;

wherein said G conductor includes a G conductor central layer portion, said G conductor central layer portion has surfaces defining a G conductor central layer portion first aperture and a G conductor central layer portion second aperture;

wherein said A conductor includes an A conductor extended portion and an A conductor layer portion;

wherein said A conductor layer portion includes surfaces defining an A conductor layer portion aperture;

wherein said B conductor includes a B conductor extended portion and a B conductor layer portion;

wherein said B conductor layer portion includes surfaces defining an B conductor layer portion aperture;

wherein said A conductor extended portion extends through said G conductor central layer portion first aperture and said B conductor layer portion aperture;

wherein said B conductor extended portion extends through said G conductor central layer portion second aperture and said A conductor layer portion aperture; and wherein said A conductor layer portion and said B conductor layer portion are on opposite sides of said G conductor central layer portion from one another.

70. A method of using a filter, said filter comprising:

a G conductor;

an A conductor;

a B conductor;

wherein said G conductor, said A conductor, and said B conductor are conductively isolated from one another when said filter is not connected in a circuit;

wherein said G conductor includes a G conductor central layer portion, said G conductor central layer portion has sources defining a G conductor central layer portion first aperture and a G conductor central layer portion second aperture;

wherein said A conductor includes an A conductor extended portion and an A conductor layer portion;

wherein said A conductor layer portion includes surfaces defining an A conductor layer portion aperture;

wherein said B conductor includes a B conductor extended portion and a B conductor layer portion;

wherein said B conductor layer portion includes surfaces defining an B conductor layer portion aperture;

wherein said A conductor extended portion extends through said G conductor central layer portion first aperture and said B conductor layer portion aperture;

wherein said B conductor extended portion extends through said G conductor central layer portion second aperture and said A conductor layer portion aperture; and wherein said A conductor layer portion and said B conductor layer portion are on opposite sides of said G conductor central layer portion from one another;

said method comprising filtering electrical energy with said filter.

* * * * *

UNITED STATES PATENT AND TRADEMARK OFFICE
CERTIFICATE OF CORRECTION

PATENT NO. : 6,954,346 B2 Page 1 of 1
DATED : October 11, 2005
INVENTOR(S) : Anthony Anthony It is certified that error appears in the above-identified patent and that said Letters Patent is hereby corrected as shown below:

Title page,
Item [73], Assignee, should read -- X2Y Attenuators, LLC, Erie, PA (US) --.

Column 5,
Line 18, should read -- wherein said B conductor first layer portion and said B conductor second layer portion are on opposite sides of said central layer portion from one another. --.

Column 17,
Line 48, should read -- wherein said B conductor first layer portion and said B conductor second layer portion are on opposite sides of said central layer portion from one another. --.

Column 18,
Line 15, should read -- wherein said B conductor first layer portion and said B conductor second layer portion are on opposite sides of said central layer portion from one another; --.

Signed and Sealed this

Twenty-eighth Day of February, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,954,346 B2 | |
| APPLICATION NO. | : 10/895062 | |
| DATED | : October 11, 2005 | |
| INVENTOR(S) | : Anthony Anthony | |

It is certified that error appears in the above-identified patent and that said Letters Patent is hereby corrected as shown below:

<u>Title page,</u>
Item [73], Assignee, should read -- X2Y Attenuators, LLC, Erie, PA (US) --.

<u>Column 5,</u>
Line 18, the text "wherein said B conductor first layer protion and said B conductor second layer portion are on opposite sides of said central layer portion from one another." (as inserted by Certificate of Correction issued February 28, 2006) should be deleted and original text as printed in patent is to be reinstated as follows: -- The G conductor includes a central layer portion and a housing portion. The housing portion is optional, but preferred. The central layer portion of the G conductor defines two apertures. --.

<u>Column 15,</u>
Lines 16-18, should read -- wherein said B conductor first layer portion and said B conductor second layer portion are on opposite sides of said central layer portion from one another. --.

UNITED STATES PATENT AND TRADEMARK OFFICE
CERTIFICATE OF CORRECTION

| | | |
|---|---|---|
| PATENT NO. | : 6,954,346 B2 | Page 2 of 2 |
| APPLICATION NO. | : 10/895062 | |
| DATED | : October 11, 2005 | |
| INVENTOR(S) | : Anthony Anthony | |

It is certified that error appears in the above-identified patent and that said Letters Patent is hereby corrected as shown below:

Column 17,
Lines 46-48, should read -- wherein said B conductor first layer portion and said B conductor second layer portion are on opposite sides of said central layer portion from one another. --.

Column 18,
Lines 12-14, should read -- wherein said B conductor first layer portion and said B conductor second layer portion are on opposite sides of said central layer portion from one another; --.

This certificate supersedes the Certificate of Correction issued February 28, 2006.

Signed and Sealed this

Seventeenth Day of March, 2009

JOHN DOLL
*Acting Director of the United States Patent and Trademark Office*